(12) United States Patent
Yadav et al.

(10) Patent No.: US 12,413,213 B1
(45) Date of Patent: Sep. 9, 2025

(54) EFFICIENT CLOCKING STRUCTURES FOR HIGH-SPEED SYSTEMS USING HYBRID DIGITAL DELAY LANES

(71) Applicant: Cadence Design Systems, Inc., San Jose, CA (US)

(72) Inventors: Jitendra Kumar Yadav, Bengaluru (IN); Sachin Ramesh Gugwad, Karnataka (IN); Hari Anand Ravi, Karnataka (IN); Hajee Mohammed Shuaeb Fazeel, Bengaluru (IN)

(73) Assignee: Cadence Design Systems, Inc., San Jose, CA (US)

( * ) Notice: Subject to any disclaimer, the term of this patent is extended or adjusted under 35 U.S.C. 154(b) by 113 days.

(21) Appl. No.: 18/457,476

(22) Filed: Aug. 29, 2023

(51) Int. Cl.
*H03K 5/06* (2006.01)
*H03K 19/003* (2006.01)
*H03K 19/173* (2006.01)

(52) U.S. Cl.
CPC ......... *H03K 5/06* (2013.01); *H03K 19/00384* (2013.01); *H03K 19/1737* (2013.01)

(58) Field of Classification Search
CPC ............... H03K 5/06; H03K 19/00384; H03K 19/1737; H03K 5/135; H03K 19/096; H03K 5/133; H03K 5/15; H03K 5/1508; H03K 5/14; H03K 5/05; G06F 1/10; G06F 1/12; G11C 7/222; H03L 7/0814; H03L 7/0818
See application file for complete search history.

(56) References Cited

U.S. PATENT DOCUMENTS

2008/0068060 A1* 3/2008 Hui ........................ H03H 11/26
327/261

* cited by examiner

*Primary Examiner* — Jung Kim
(74) *Attorney, Agent, or Firm* — Mark H. Whittenberger; Holland & Knight LLP

(57) ABSTRACT

A high-speed clocking circuit may include a single path digitally controlled coarse delay line including multiple stages. Each of the multiple stages may include a plurality of inverters and a logic gate electrically connected in series that are configured to enable a forward path of the single path digitally controlled coarse delay line prior to disabling a return path of the single path digitally controlled coarse delay line to minimize glitching.

20 Claims, 44 Drawing Sheets

| SET PNT | T1 END | T2 END | T3 END | T4 END | T5 END | T6 END | T7 END | T8 END |
|---|---|---|---|---|---|---|---|---|
| 1.2 | 1 | 0 | 0 | 0 | 0 | 0 | 0 | 0 |
| 2.3 | 1 | 1 | 0 | 0 | 0 | 0 | 0 | 0 |
| 3.4 | 1 | 1 | 1 | 0 | 0 | 0 | 0 | 0 |
| 4.5 | 1 | 1 | 1 | 1 | 0 | 0 | 0 | 0 |
| 5.6 | 1 | 1 | 1 | 1 | 1 | 0 | 0 | 0 |
| 6.7 | 1 | 1 | 1 | 1 | 1 | 1 | 0 | 0 |
| 7.8 | 1 | 1 | 1 | 1 | 1 | 1 | 1 | 0 |

| Coarse Delay line code | Fine delay line code Min to Max |
|---|---|
| 1 | 0 to 8 |
| 2 | 8 to 0 |
| 3 | 0 to 8 |
| 4 | 8 to 0 |
| 5 | 0 to 8 |
| 6 | 8 to 0 |
| ... | ... |

EFFICIENT CLOCKING STRUCTURES FOR HIGH-SPEED SYSTEMS USING HYBRID DIGITAL DELAY LANES

FIELD OF THE INVENTION

Embodiments of the present disclosure relate to use of delay lines in memory interfaces and, more particularly, to using hybrid digital delay lines for more efficient clocking.

BACKGROUND

Memory modules may use clocking schemes to interface with other system components. The clocking schemes may use delay lines to align various read and write signals. For example, a data signal (DQ) may be a data line that transfers bits on leading edges and falling edges of a clock signal. Further, a clock strobe or data strobe (DQS) may be the clock signal for the data line. A delay line scheme may be used to align the clock strobe DQS with the data signal DQ. The delay line scheme may have an associated delay line code.

SUMMARY

Accordingly, a high-speed clocking circuit is provided. The circuit may include a single path digitally controlled coarse delay line including multiple stages. Each of the multiple stages may include a plurality of inverters and a logic gate electrically connected in series that are configured to enable a forward path of the single path digitally controlled coarse delay line prior to disabling a return path of the single path digitally controlled coarse delay line to minimize glitching.

One or more of the following features may be included. In some embodiments, the logic gate may include a NAND gate including a plurality of PMOS having a gate width of approximately 4N and a plurality of NMOS having a gate width of approximately N. The circuit may further include a dual path coarse delay line electrically connected with the single path digitally controlled coarse delay line to generate a hybrid dual path coarse delay line. The single path digitally controlled coarse delay line may include anti-aging circuitry configured to compensate for duty cycle distortion. The anti-aging circuitry may operate based upon, at least in part, an encoding scheme configured to toggle at least a portion of the single path digitally controlled coarse delay line. The anti-aging circuitry may include a multiplexer configured to receive a toggle signal and to generate an output to a NAND gate and a plurality of inverters. The logic gate may include a NAND gate. The logic gate may include an XOR gate that is fed by at least one additional inverter. The hybrid dual path coarse delay line may further include a fine delay line. The hybrid dual path coarse delay line may further include a base delay line and an adder delay line.

In another embodiment of the present disclosure, a high-speed clocking method is provided. The method may include providing a single path digitally controlled coarse delay line including multiple stages, wherein each of the multiple stages includes a plurality of inverters and a logic gate electrically connected in series. The method may further include enabling a forward path of the single path digitally controlled coarse delay line prior to disabling a return path of the single path digitally controlled coarse delay line to minimize glitching.

One or more of the following features may be included. In some embodiments, the logic gate may include a NAND gate including a plurality of PMOS having a gate width of approximately 4N and a plurality of NMOS having a gate width of approximately N. The method may further include electrically connecting a dual path coarse delay line with the single path digitally controlled coarse delay line to generate a hybrid dual path coarse delay line. The method may further include compensating for duty cycle distortion using anti-aging circuitry associated with the single path digitally controlled coarse delay line. The method may also include toggling at least a portion of the single path digitally controlled coarse delay line based upon, at least in part, an encoding scheme associated with the anti-aging circuitry. The method may further include receiving a toggle signal at a multiplexer associated with the anti-aging circuitry, generating an output at the multiplexer and providing the output to a NAND gate and a plurality of inverters. The logic gate may include a NAND gate or an XOR gate that is fed by at least one additional inverter. The hybrid dual path coarse delay line may further include a fine delay line. The hybrid dual path coarse delay line may further include a base delay line and an adder delay line.

It is to be understood that both the foregoing general description and the following detailed description are exemplary and explanatory and are intended to provide further explanation of embodiments of the present disclosure as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 7A is a table illustrating an example delay line encoding according to an embodiment of the present disclosure;

FIG. 7B is a table illustrating example thermometric code according to an embodiment of the present disclosure;

FIG. 8 is a table showing example delay line codes according to an embodiment of the present disclosure;

DETAILED DESCRIPTION

Figure 1:
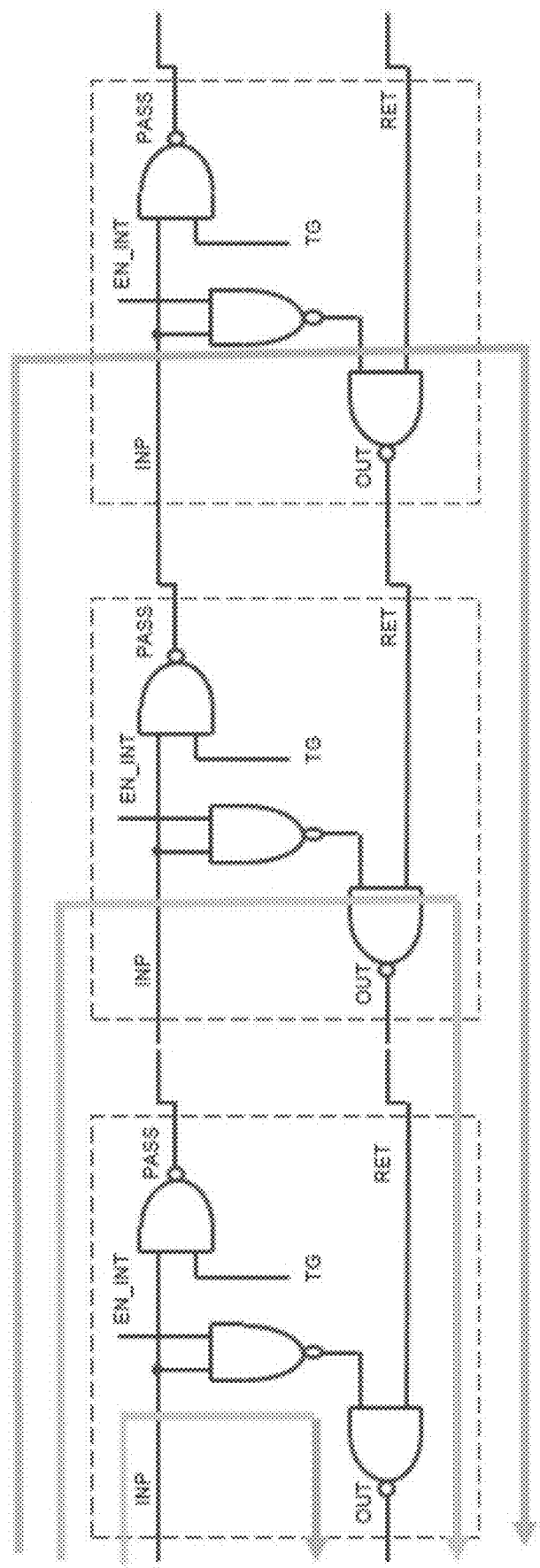
FIG. 1 is a diagram showing an example coarse delay line structure.

Reference will now be made in detail to the embodiments of the present disclosure, examples of which are illustrated in the accompanying drawings. The present disclosure may, however, be embodied in many different forms and should not be construed as being limited to the embodiments set forth herein; rather, these embodiments are provided so that this disclosure will be thorough and complete, and will fully convey the concept of the present disclosure to those skilled in the art. In the drawings, the thicknesses of layers and regions may be exaggerated for clarity. Like reference numerals in the drawings denote like elements.

Memory interfaces such as low-power double data rate 5 (LPDDR5) interfaces may be used widely in consumer applications and devices such as mobile phones and laptops. Such applications may demand a relatively small footprint for an integrated circuit (IC) chip on a printed circuit board (PCB) of a device. Thus, it may be desirable to reduce area and power usage for memory interfaces (e.g., LPDDR5 interfaces) to make them more competitive in the market.

A clocking scheme for memory interfaces (e.g., LPDDR5 interfaces or double data rate 5 (DDR5) interfaces) may use delay lines to align a clock strobe (DQS or clock signal or strobe signal) with a data signal DQ on a read side and a write side of an interface between a system-on-a-chip (SOC) and a memory. The delay lines may be trained and/or aligned during initialization. Delay line codes may be calibrated during initialization to align the data signal and the strobe signal for better sampling of the data signal by the strobe signal. Time may cause the delay of the delay line to change as voltage and temperature conditions change. A periodic update scheme which may update the delay line code may keep the delay constant with the change in the voltage and the temperature. In other words, after initialization, the delay line may have a drift in delay caused by changing voltage and temperature which may need to be corrected periodically by updating the delay line code. Thus, in order to track the voltage-temperature (VT) drift of the delay line delay, an update mechanism may be needed to update the delay line code periodically.

Some mechanisms used to update the delay line code may introduce problems (e.g., glitches) in the clock strobe (DQS or clock signal) when the delay line code is updated. For example, existing schemes for updating the delay line code may cause a glitch on an output when the delay line code is updated. The glitch may issue a false strobe clock edge and corrupt data being read from or written to the memory.

Such problems may not be optimal for on-the-fly, dynamic updating of the delay line code and may require complicated clock gating and sequencing operations in the physical layer (PHY) with a memory controller to ensure that data is not exchanged between the SOC and the memory during the updating of the delay line code. For example, the clock gating and sequencing operations may increase the area and complexity of the PHY. Further, preventing transfer of data during the delay line code update operation may reduce the bandwidth of the system. As such, there may be a need for a streamlined, on-the-fly, dynamic updating scheme to update the delay line code without causing such problems in the delay line output. The techniques and features described by the present disclosure may simplify the PHY and save area and power spent on clock gating and sequencing operations previously required.

Referring to FIG. 1, an example coarse delay line structure for a memory is shown. Coarse delay line 100 may incorporate a trombone structure and may include delay cells with NAND gates that form a delay line. Control signals EN_INT, RET, and TG may be switched to add successive coarse delay elements in the delay line and ultimately increase the delay. For example, each successive coarse delay element may add a delay corresponding to two NAND gates in the delay line.

Figure 2:
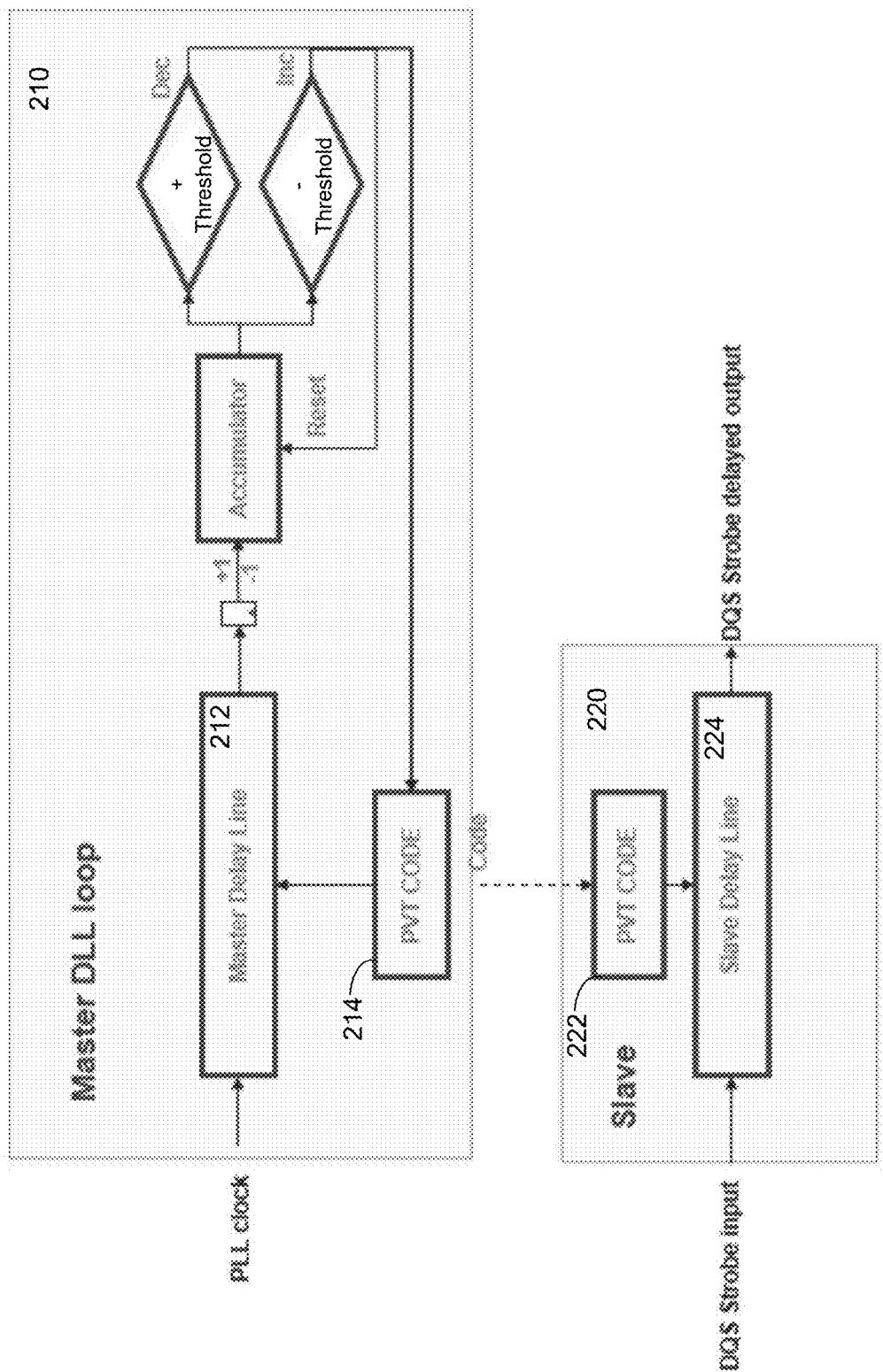
FIG. 2 is a diagram showing an example delay-locked loop architecture.

Referring to FIG. 2, an example delay-locked loop (DLL) architecture is shown. DLL 200 may include a master DLL loop 210 and a slave 220 with a strobe (DQS) input and a strobe (DQS) delayed output. FIG. 2 illustrates an example scheme that may be used to keep the delay of the delay line constant. The master DLL loop 210 may include a master delay line 212 which may run in a loop to calibrate the master delay line 212 to a fixed delay (for e.g., two-bit periods or unit intervals (UI)). The delay line code (e.g., process, voltage, and temperature (PVT) code 214) of the master delay line 212 may be continuously being updated to keep the delay fixed. The delay line code (e.g., PVT code 214) of the master delay line 212 may be compared with the slave delay line 224 and the PVT code 222 of the slave 220 may be updated to keep the delay constant with time.

Figure 3:
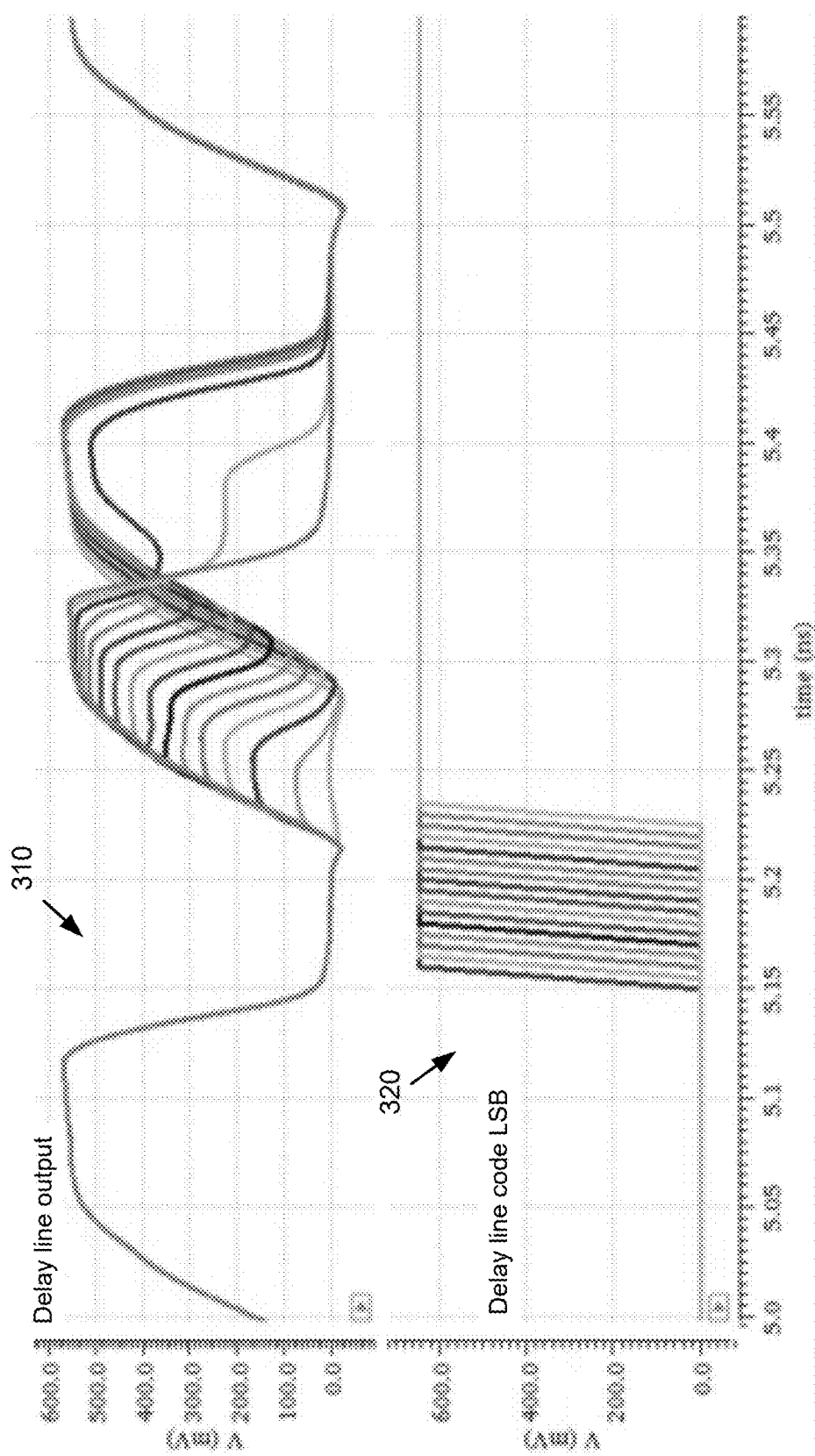
FIG. 3 is a graph showing an example delay line output.

Referring to FIG. 3, a graph showing an example delay line output is shown. Graph 300 shows a delay line output 310 as a delay line code least-significant bit (LSB) 320 is switched. A switching position of the delay line code may be swept in time with respect to the strobe (DQS). As shown in graph 300, a glitch in the delay line output 310 may occur when switching the delay line code. The glitch may create extra strobe (DQS) clock edges and may corrupt data transfer associated with the memory. As will be described below, the techniques and features of the present disclosure may provide a glitch-free delay line output.

Figure 4:
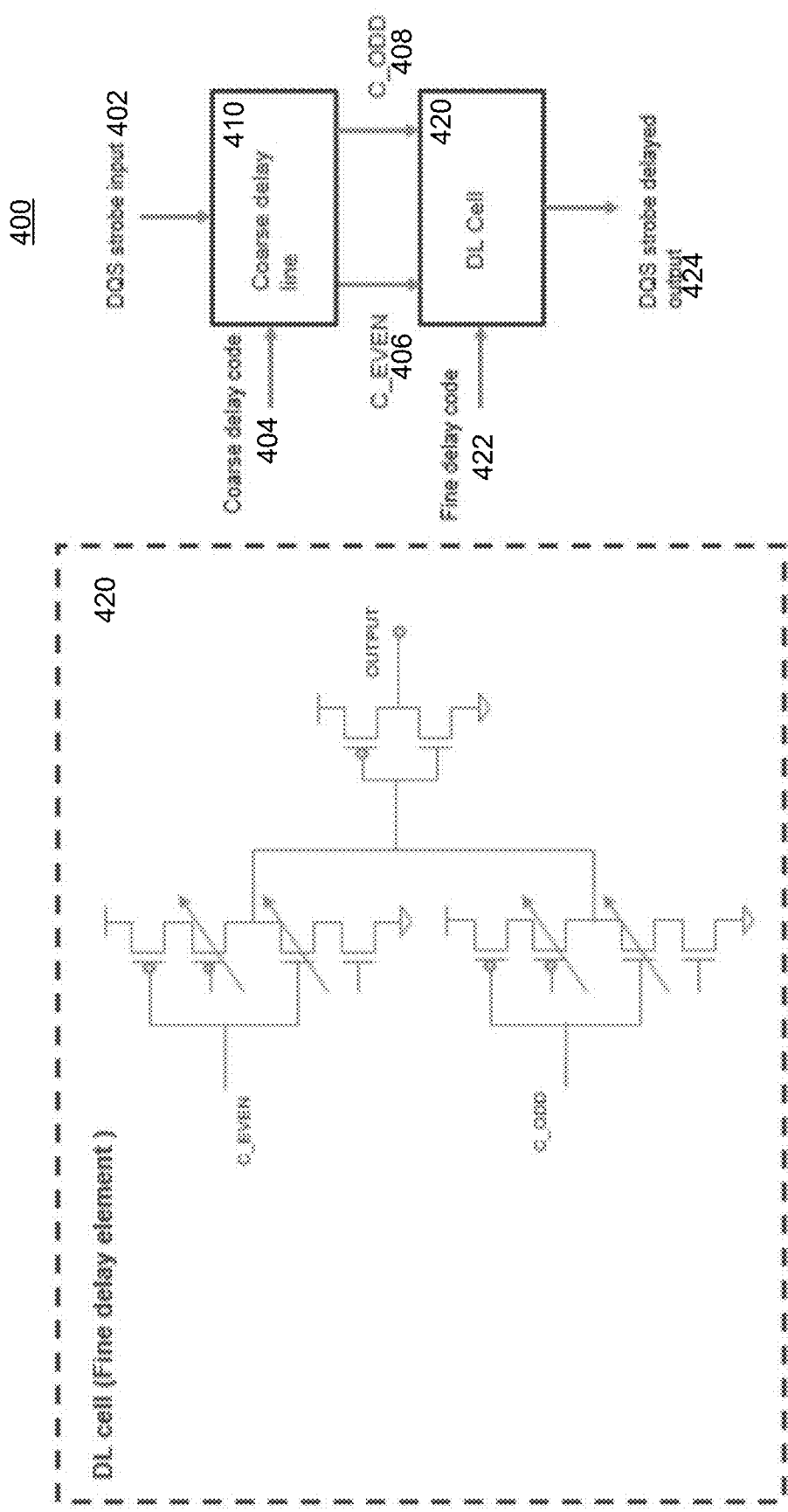
FIG. 4 is a diagram showing an example circuit according to an embodiment of the present disclosure.

Referring to FIG. 4, in some embodiments, a circuit 400 for updating a delay line code may include a coarse delay line 410 having a first chain of interleaved logic gates and a second chain of interleaved logic gates. The coarse delay line 410 may be configured to receive a strobe input 402 and a coarse delay cell code 404. The circuit may further include a first clock path 406 (e.g., from a clock C_EVEN) generated based upon the first chain of interleaved logic gates. The circuit may also include a second clock path 408 (e.g., from a clock C_ODD) generated based upon the second chain of interleaved logic gates. The circuit may additionally include a fine delay cell 420 in electronic communication with the coarse delay cell 410. The fine delay cell 420 (also called DL cell or fine delay element) may be configured to receive the first clock path 406, the second clock path 408, and a fine delay cell code 422. The circuit may further include a strobe (DQS) delayed output 424 generated based upon, at least in part, the first clock path 406, the second clock path 408, and the fine delay code 422.

Figure 5:
FIG. 5 is a flowchart showing an example process for updating a delay line code according to an embodiment of the present disclosure.

Referring to FIG. 5, in some embodiments, a method 500 for updating a delay line code may include receiving 502 the strobe input 402 at the coarse delay line 410. The method 500 may further include receiving 504 the coarse delay cell code 404 at the coarse delay line 410. The method 500 may also include generating 506 the first clock path 406 (e.g., from the clock C_EVEN) based upon a first chain of interleaved logic gates included within the coarse delay line 410. The method 500 may additionally include generating 508 a second clock path 408 (e.g., from the clock C_ODD) based upon a second chain of interleaved logic gates included within the coarse delay line 410. In other words, in some embodiments, two intermediate clocks C_EVEN and C_ODD may be generated by one or more interleaved chains of logic gates. The logic gates may be interleaved in a manner that increases a delay in coarse steps of a fixed number of logic gates such as NAND gates (e.g., two NAND gates for each increment in the coarse delay line code). Thus, the coarse delay line 410 may include a plurality of delay cells associated with the first clock path 406 and/or the second clock path 408.

The method 500 may further include receiving 510 the first clock path 406, the second clock path 408, and the fine delay cell code 422 at the fine delay cell 420. The method 500 may also include generating 512 the strobe delayed output 424 based upon, at least in part, the first clock path 408, and the second clock path 408, and the fine delay code 422. In other words, the final output of the delay line (e.g., the strobe delayed output 424) may be generated by inter-polating the two input clocks C_EVEN and C_ODD using a fine interpolation delay cell (e.g., fine delay cell 420). The two clocks C_EVEN and C_ODD may be spaced apart by a fixed number of logic gates (e.g., two NAND gates). In other words, in some embodiments, the coarse delay line 410 may include a plurality of delay cells associated with the first clock path and/or the second clock path and each of the plurality of delay cells may include a plurality of logic gates such as NAND gates.

As will be discussed further below, both the coarse delay code 404 and the fine delay (cell) code 422 may be switched. In some embodiments, when the coarse delay code 404 is switched, the fine delay cell output (e.g., the strobe delayed output 424) may depend on only one of the two inputs clocks C_EVEN or C_ODD. In other words, the fine delay cell output (e.g., the strobe delayed output 424) may depend on only one of the first clock path 406 and the second clock path 408 when switching the coarse delay code 404.

In some embodiments, the method 500 may include determining 514 that the strobe delayed output 424 depends on the second clock path 408 (e.g., from the clock C_ODD). The method 500 may further include, based at least in part on determining that the strobe delayed output 424 depends on the second clock path 408, switching 516 the clock on the first clock path 506. When the fine delay cell output (e.g., the strobe delayed output 424) depends on the clock C_ODD, the clock C_EVEN may be switched. Further, the method 500 may include, based at least in part on determining that the strobe delayed output 424 depends on the second clock path 408, increasing 518 a number of logic gates such as NAND gates to increase the delay on the chain of logic gates for the clock C_EVEN. In other words, if the strobe delayed output 424 depends on the second clock path 408, the clock C_EVEN on the first clock path 406 may be switched and the number of logic gates such as NAND gates maybe increased to increase the delay on the first chain of interleaved logic gates. In this case, because the output of the delay line depends on the clock C_ODD, switching the clock C_EVEN may not generate a glitch on the delay line output.

Further, in some embodiments, the method 500 may include determining 520 that the strobe delayed output 424 depends on the first clock path 406 (e.g., from the clock C_EVEN). The method 500 may also include, based at least in part on determining that the strobe delayed output 424 depends on the first clock path 406, switching 522 the clock on the second clock path 408. When the fine delay cell output (e.g., the strobe delayed output 424) depends on the clock C_EVEN, the clock on C_ODD may be switched. Further, the method 500 may include, based at least in part on determining that the strobe delayed output 424 depends on the first clock path 406, increasing 524 a number of logic gates such as NAND gates to increase the delay on the chain of logic gates for the clock C_ODD. In other words, if the strobe delayed output 424 depends on the first clock path 406, the clock C_ODD on the second clock path may be switched and a number of logic gates such as NAND gates may be increased to increase a delay on the second chain of interleaved logic gates. In this case, because the output of the delay line depends on the clock C_EVEN, switching the clock C_ODD may not generate a glitch on the delay line output.

Additionally, in some embodiments, the method 500 may include switching 528 the fine delay cell code after the coarse delay cell code is switched. The fine delay codes may be switched one code at a time or simultaneously (e.g., at about or near the same time). Because a time gap between two fine delay codes may be relatively low, switching the fine delay codes simultaneously may not cause glitch.

On-the-fly switching of delay lines may be enabled by generating the two outputs C_EVEN and C_ODD (e.g., by the coarse delay line). The two clocks C_EVEN and C_ODD may be spaced apart by a fixed number of logic gates such as NAND gates (e.g., two NAND gates). As shown in FIG. 4, the final delay line output may be generated by providing the two clocks C_EVEN and C_ODD as input (e.g., as first clock path 406 and second clock path 408) to the fine delay line cell 420.

Figure 6:
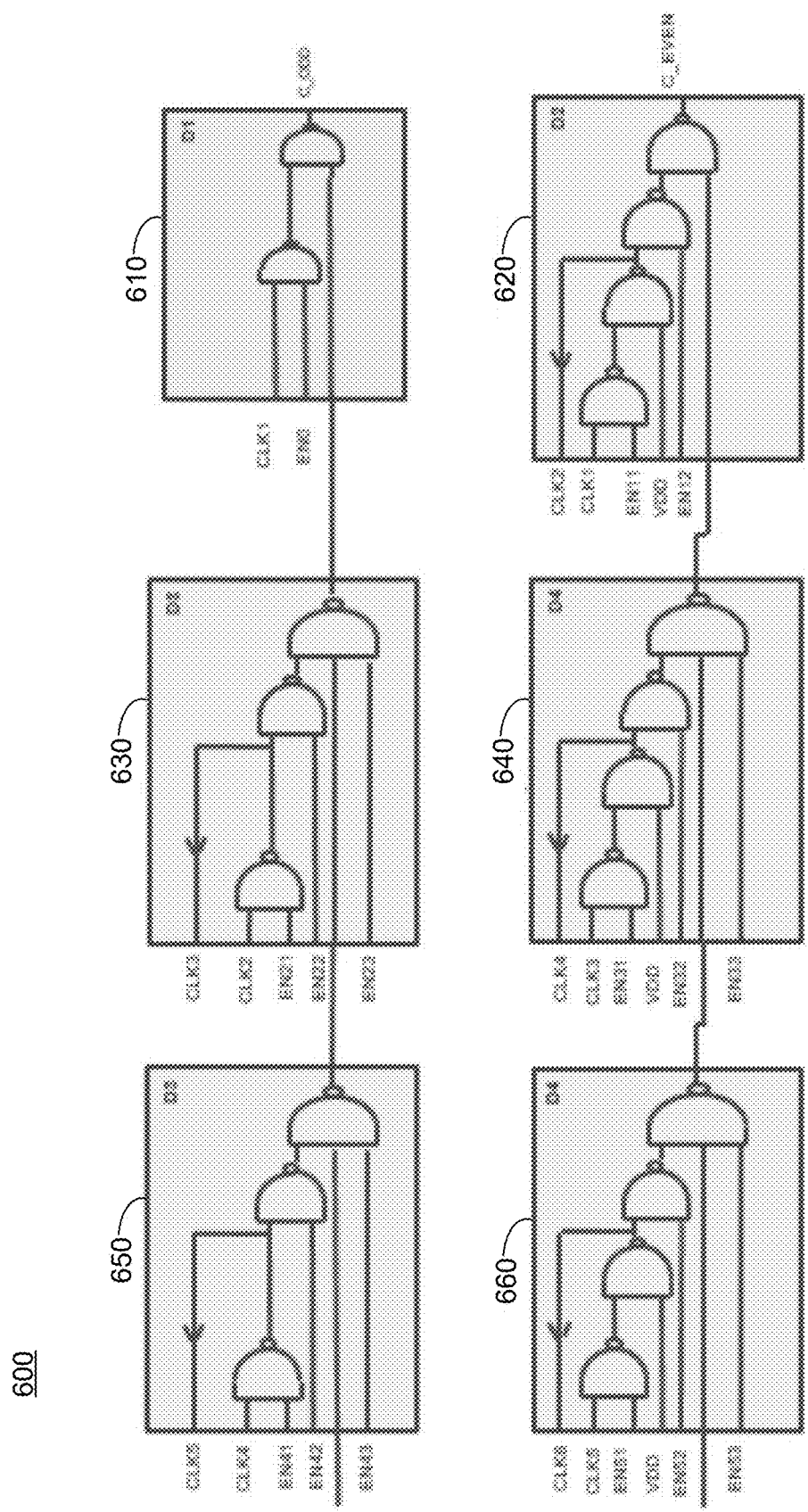
FIG. 6 is a diagram showing an example coarse delay line structure according to an embodiment of the present disclosure.

Referring to FIG. 6, an example coarse delay line structure 600 according to an embodiment of the present disclosure is shown. In some embodiments, the coarse delay line 410 may incorporate a structure similar to the coarse delay line structure 600 and may include four types of delay cells (e.g., D1, D2, D3, and D4) to form a coarse delay line. The delay line cell types D1 and D2 may be the first and second instances (shown as delay cell 610 and delay cell 620, respectively) of the coarse delay line (e.g., coarse delay line 410). The third and fourth instances (shown as delay cell 630 and delay cell 640, respectively) of the coarse delay line (e.g., coarse delay line 410) may be delay line cell types D3 and D4. The coarse delay line structure 600 may be extended further by adding more delay cell types D3 and D4 alternatively (e.g., shown as delay cell 650 and delay cell 660, respectively). In other words, the fifth (e.g., delay cell 650), seventh (not shown), and ninth (not shown) delay cells may be delay cell type D3, and the sixth (e.g., delay cell 660), eighth (not shown), and tenth (not shown) delay cells may be delay cell type D4. The clock CLK1 (shown at delay cell 610) may be an input clock to the coarse delay line (e.g., coarse delay line 410).

Figure 7A:
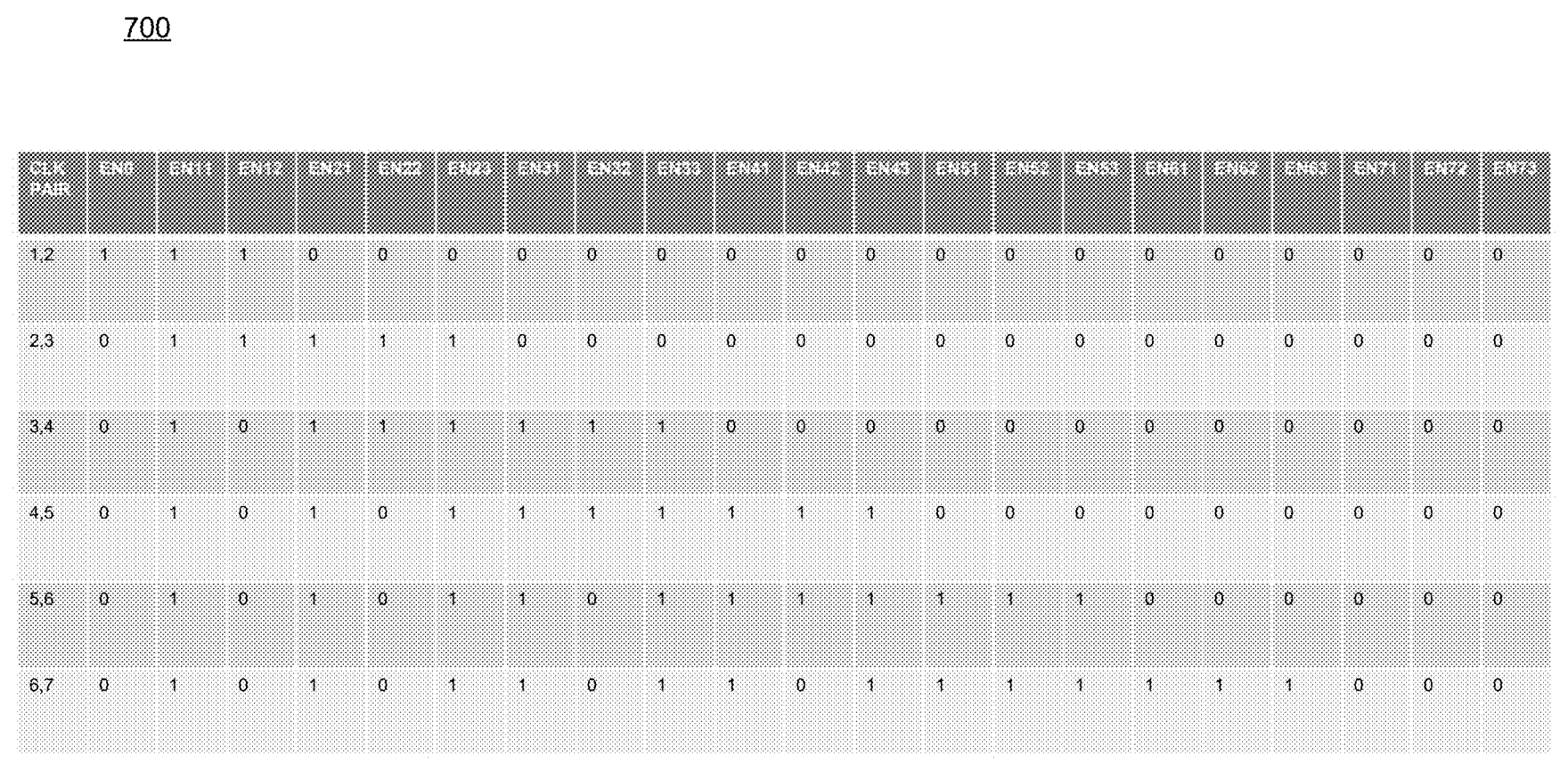
Figure 7C:
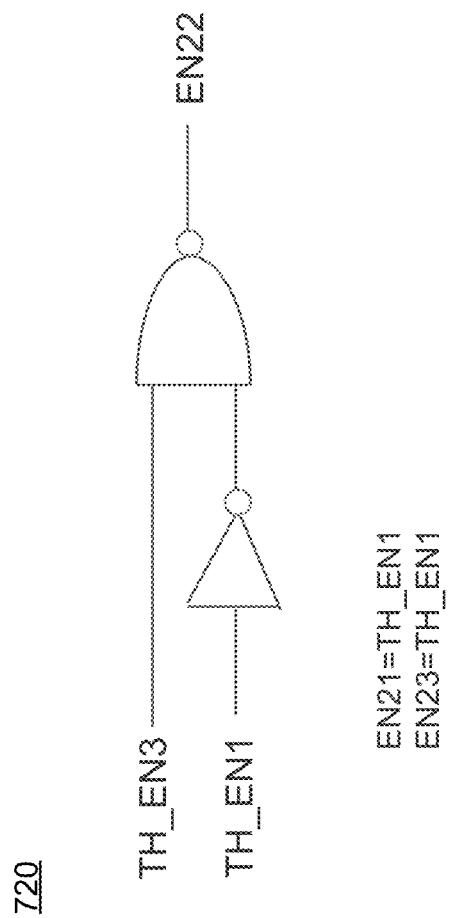
FIG. 7C is shows example logic according to an embodiment of the present disclosure.

Referring to FIG. 7A, an example delay line encoding table 700 according to an embodiment of the present disclosure is shown. The delay line encoding table 700 shows encoding or enable codes corresponding to the coarse delay line cells and may be used to increment and/or decrement the delay line code. The enable codes may be generated using a thermometric code input to the coarse delay line. Referring to FIG. 7B, a table 710 illustrating example thermometric code input according to an embodiment of the present disclosure is shown. The enable codes of FIG. 7A may be generated from the thermometric codes shown in FIG. 7B using logic. An example of such logic is illustrated by logic 720 of FIG. 7C. The delay line encoding of table 700 may ensure that the delay can be incremented and/or decremented on the delay line, one coarse code at a time, without disturbing the clock path being sent to the strobe delayed output 424.

Referring to FIG. 8, a table 800 showing example delay line codes according to an embodiment of the present disclosure is shown. The table 800 shows fine delay line codes for a fine delay line cell (e.g., fine delay line cell 420 of FIG. 4) having 8 thermometric inputs and corresponding to coarse delay line codes. The fine delay line cell may have segments to enable switching of the delay in fine steps.

For example, the fine delay cell code may be represented by eight thermometrically encoded bits. For odd codes, 0 may be a minimum fine delay cell code. Code 0 on the fine delay cell may imply that all outputs depend on the C_ODD clock. For 0, all fine delay cell interpolator legs may be switched to the C_ODD clock. For even codes, 8 may be the minimum fine delay cell code. Code 8 on the fine delay cell may imply that all outputs depend on the C_EVEN clock. Switching the fine delay cell code to 8 may switch the interpolator legs to the C_EVEN clock. For 8, all fine delay cell interpolator legs may be switched to the C_EVEN clock.

For example, in an implementation of a fine delay cell (e.g., the fine delay cell 420 of FIG. 4), eight tristate inverters may be connected in parallel with the C_EVEN clock as input and eight tristate inverters may be connected in parallel with the C_ODD clock as input. The outputs of the tristate inverters may be shorted together. Each tristate inverter may be an interpolator leg. Code 8 on fine delay cell may enable the eight tristate inverters with the C_EVEN clock as input and may disable the eight tristate inverters with the C_ODD clock as input. Code 0 on fine delay cell may enable the eight tristate inverters with C_ODD clock as input and may disable the eight tristate inverters with the C_EVEN clock as input. Switching the fine delay cell code to 0 may switch all the interpolator legs to the C_ODD clock. Code 6 on fine delay cell may imply that the output clock is an interpolation of the C_EVEN clock and the C_ODD clock with the delay being two fine delay codes earlier/later than C_EVEN clock and six fine delay codes earlier/later than C_ODD clock.

The coarse delay line code may be switched by one code at a time. When dynamically switching the coarse delay line code, the output of the fine delay cell may preferably be set to depend on the clock which is not being switched on the coarse delay line. Coarse delay line code will be stepped in steps of 1. For example, when coarse delay line code is being switched increased 4 to 5, the output clock is set to depend only on the C_EVEN clock and fine delay code may be 8. If the coarse delay line code is being switched from 5 to 6, the output clock may be preferably be set to depend only on C_ODD clock and fine delay line code may be 0.

Switching the fine delay cell code may be performed after the coarse delay line code switching is performed. The fine delay codes may be switched one code at a time. Because the time gap between two fine delay codes is low, switching fine delay codes simultaneously (e.g., at near or about the same time) may not cause a glitch (e.g., as can be seen below in FIG. 16).

Figure 9:
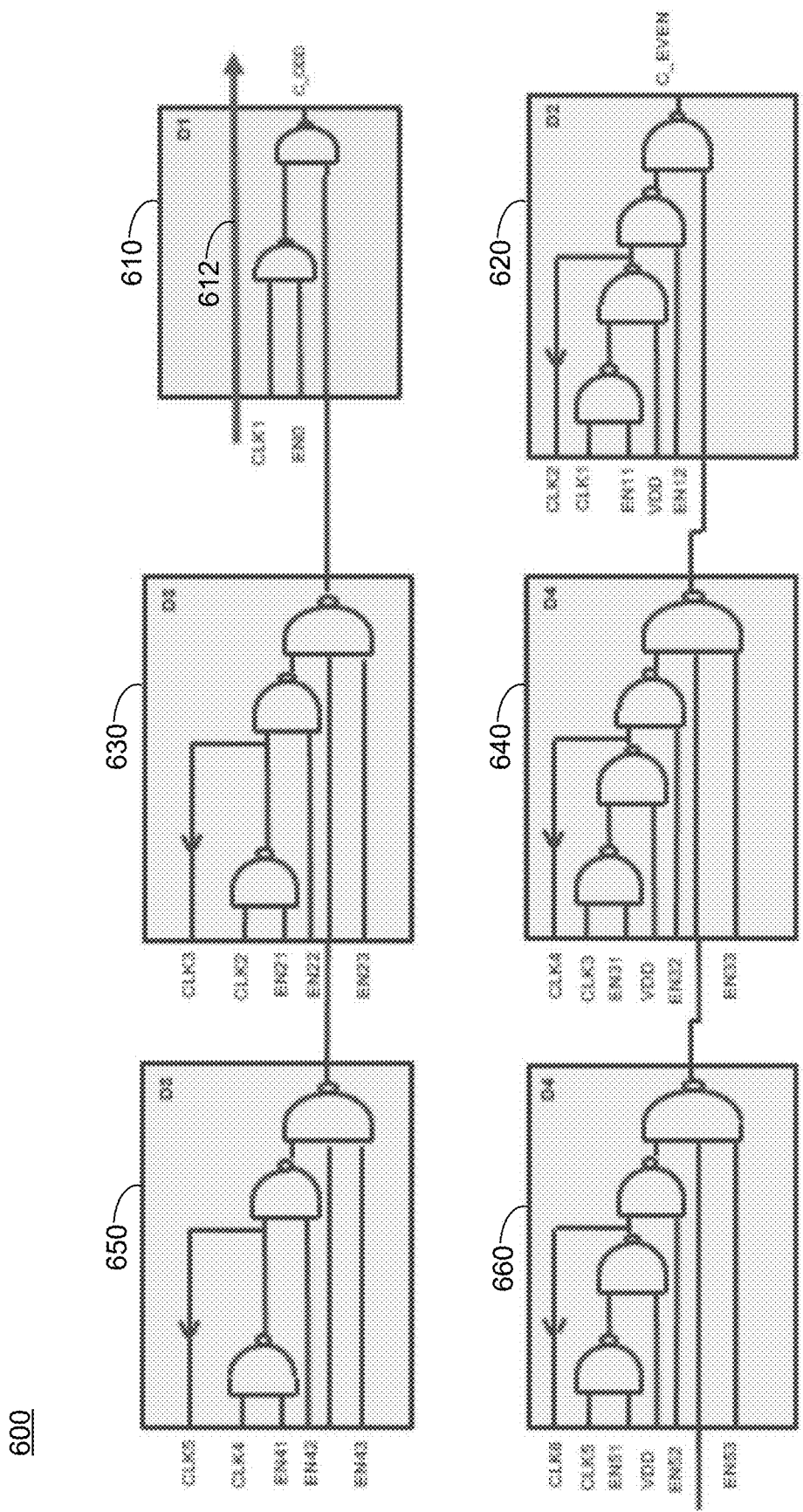
FIGS. 9-12 illustrate further details related to the coarse delay line structure of FIG. 6.

FIGS. 9-12 illustrate further details related to the coarse delay line structure 600 of FIG. 6. Referring to FIG. 9, for coarse delay line code 1, the output clock C_ODD of delay cell 610 may be generated from the clock CLK1 input by two NAND gate delays in delay cell 610. In other words, in the first coarse delay cell for the coarse delay line (e.g., coarse delay line 410), the clock CLK1 output may be sent to output C_ODD (e.g., as indicated by arrow 612).

Figure 10:
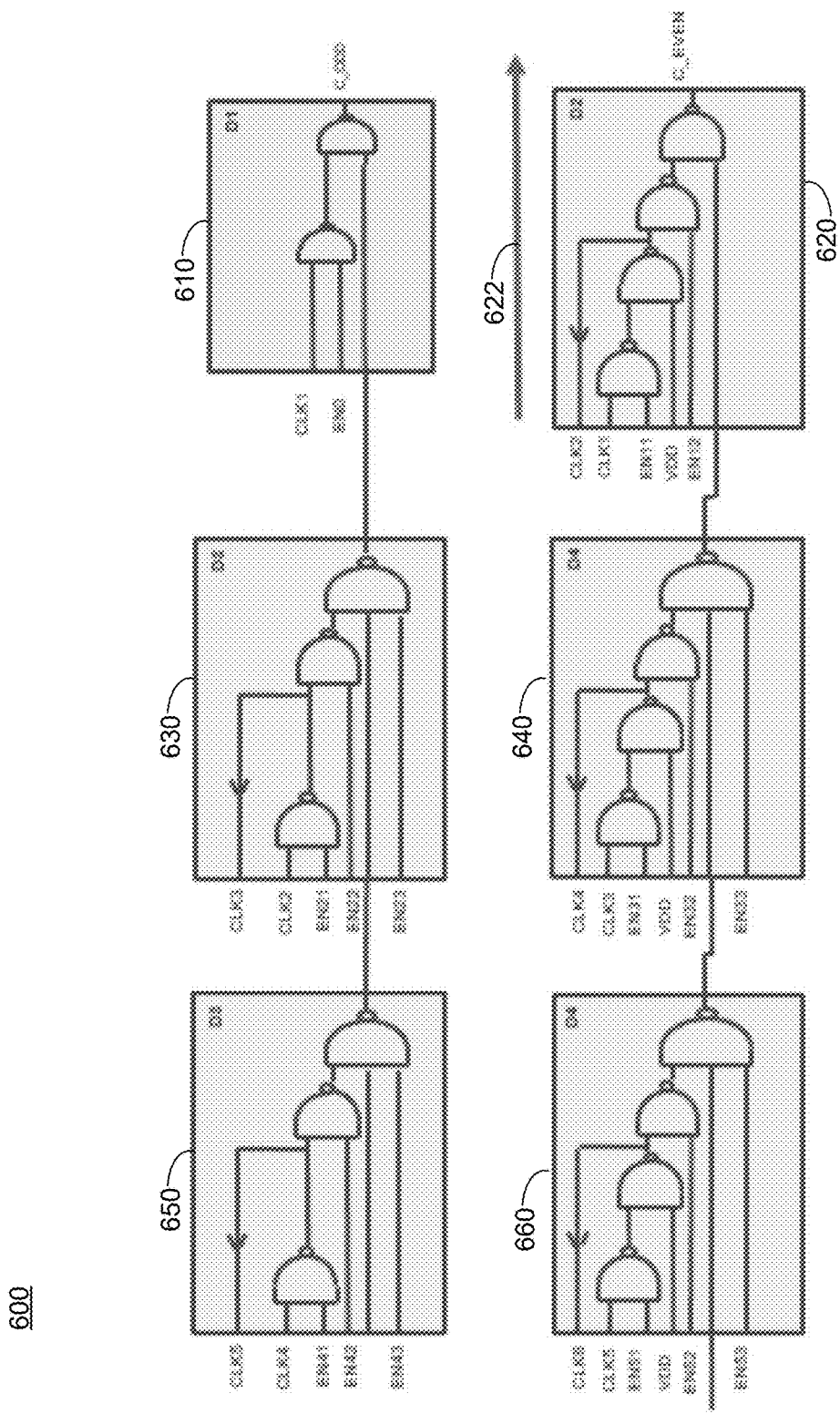

Referring to FIG. 10, for the coarse delay line code 2, the output clock C_EVEN may be generated from the clock CLK1 input by four NAND gate delays in the delay cell 620. An intermediate clock CLK2 may be generated and sent to the delay cell 630 with two NAND gate delays. In other words, for the second coarse delay cell for the coarse delay line (e.g., coarse delay line 410), the clock CLK1 may be delayed generating clock CLK2, which may be sent output C_EVEN (e.g., as indicated by arrow 622). Reusing the clock CLK2 in the delay cell 630 may minimize a mismatch between the clocks C_EVEN and C_ODD and may also save area (e.g., in the PHY).

Figure 11:
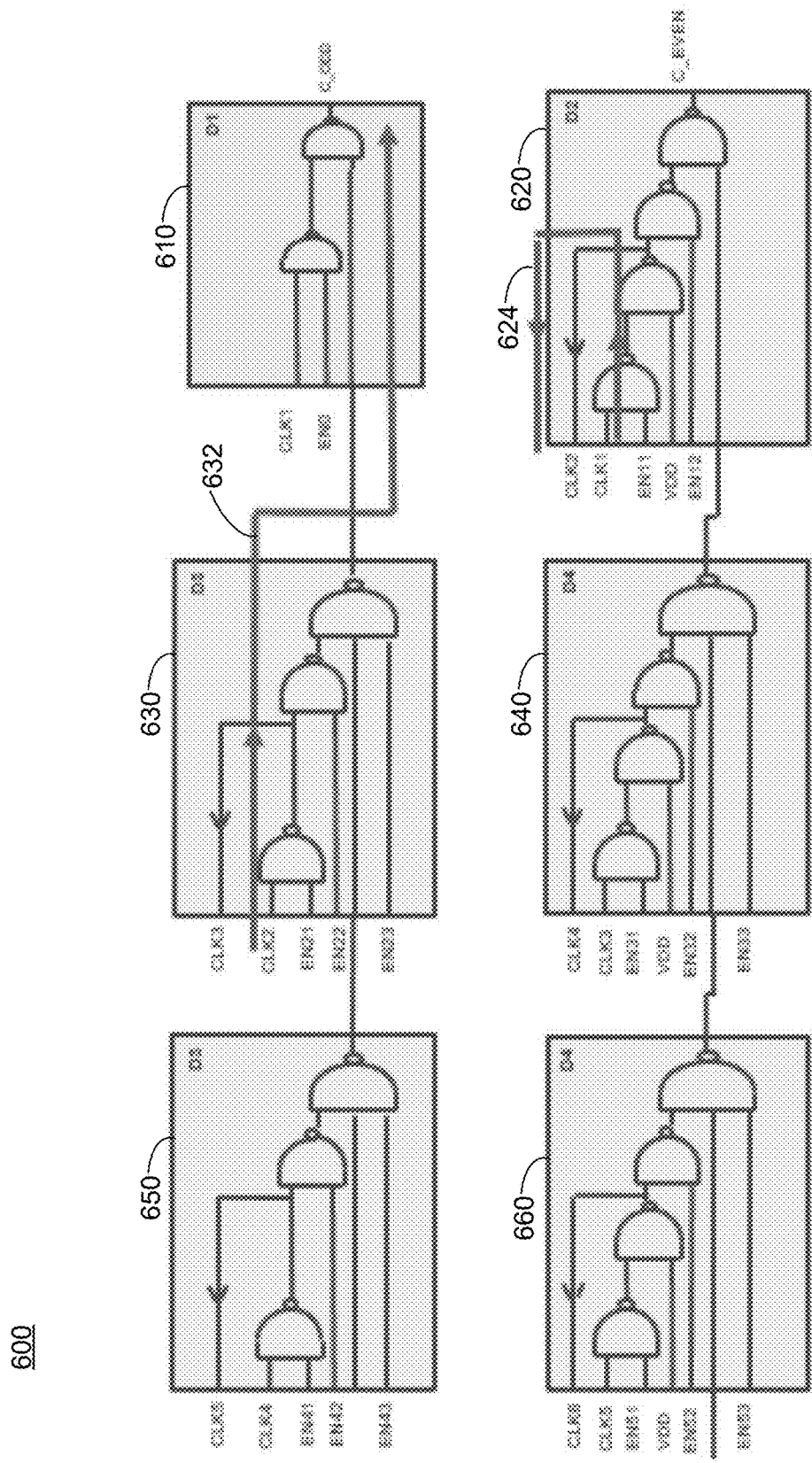

Referring to FIG. 11, for the coarse delay line code 3, the output clock C_ODD may be generated from the clock CLK2 input using five NAND gate delays in the delay cell 630 and delay cell 610. The total number of NAND gates from input clock CLK1 may be six NAND gates. An intermediate clock CLK3 may be generated from the clock CLK2 by one NAND gate and may be sent to delay cell 640. In other words, for the third coarse delay cell for the coarse delay line (e.g., coarse delay line 410), the clock CLK1 may be delayed to generate the clock CLK2 (e.g., as indicated by the arrow 624) and the clock CLK3, which may be sent to the output C_ODD (e.g., as indicated by the arrow 632).

Figure 12:
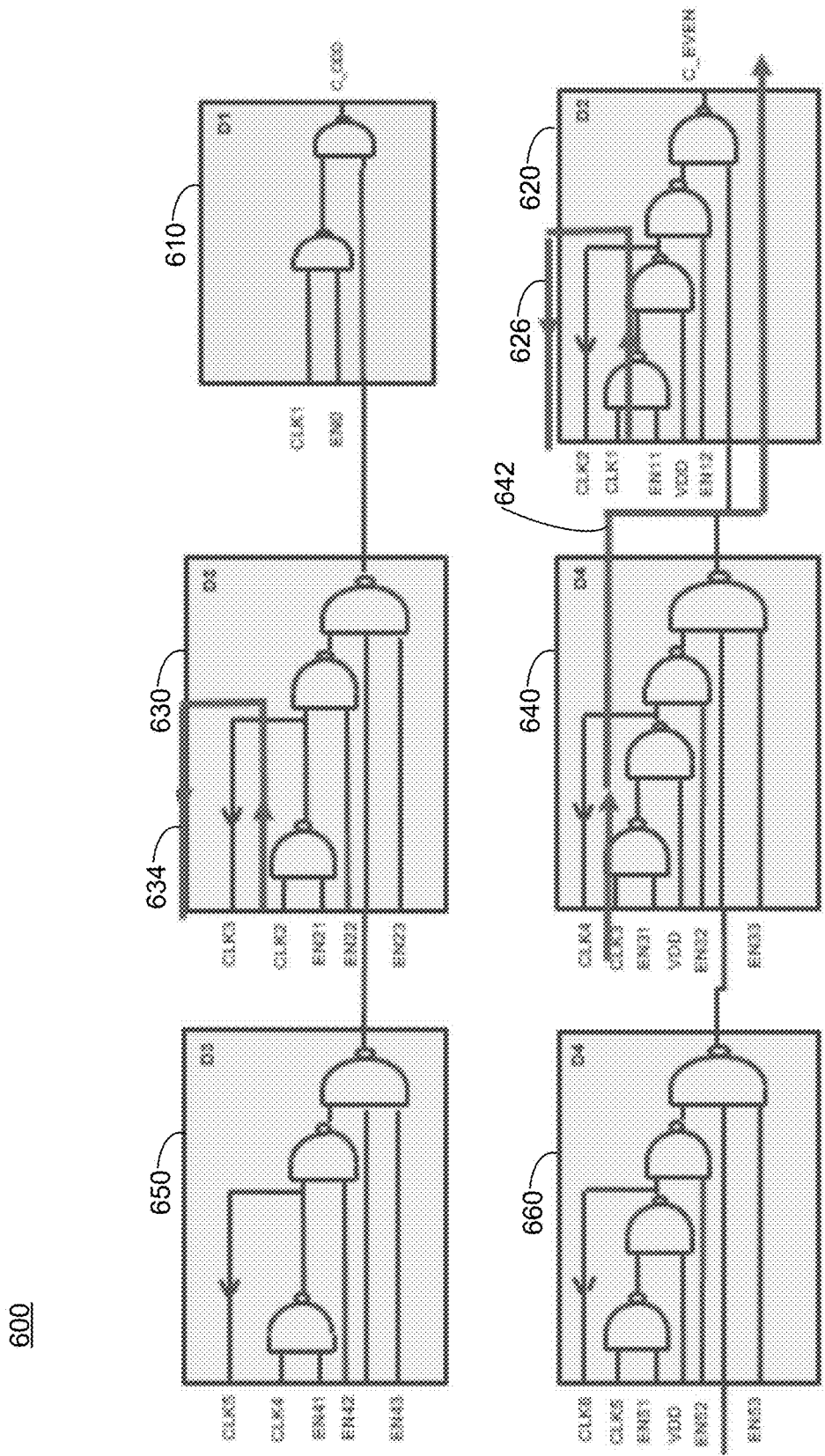

Referring to FIG. 12, for the coarse delay line code 4, the output clock C_EVEN may be generated by delaying the clock CLK3 by NAND gate delays in the delay cell 640 and the delay cell 620. An intermediate clock CLK4 may be generated from the clock CLK3 with 2 NAND gate delays and may be sent to the delay cell 650. In other words, for the fourth coarse delay cell for the coarse delay line (e.g., coarse delay line 410), the clock CLK1 may be delayed to generate the clock CLK2 (e.g., as indicated by the arrow 626), the clock CLK3 (e.g., as indicated by the arrow 634), and the clock CLK4 (e.g., as indicated by the arrow 642), which may be sent to the output C_EVEN.

Figure 13:
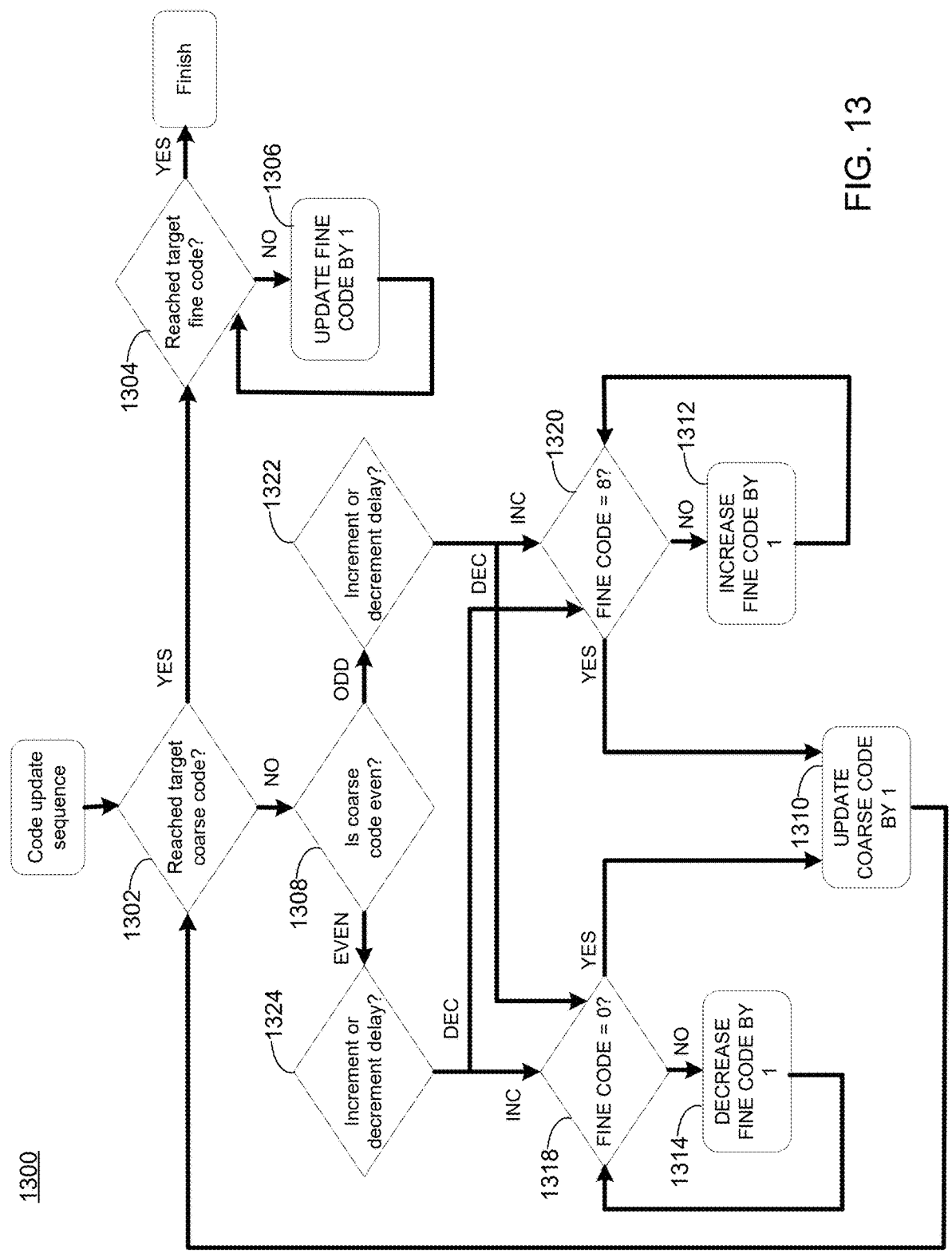
FIG. 13 is flowchart illustrating an example sequence for updating a delay line code according to an embodiment of the present disclosure.

Referring to FIG. 13, a flowchart illustrating an example method/sequence 1300 for updating a delay line code according to an embodiment of the present disclosure is shown. In some embodiments, the method 1300 for performing the code update sequence may include determining 1302 whether a target coarse code has been reached. The method 1300 may further include determining 1304 whether a target fine code has been reached. If the target coarse code and the target fine code have been reached, the sequence may be finished. The method 1300 may also include, if the target fine code is not reached, updating 1306 the fine code by one until the target fine code is reached. The method 1300 may additionally include, if the target coarse code is not reached, determining 1308 if the coarse code is even. Moreover, the method 1300 may include updating 1310 the coarse code until the target coarse code is reached.

In some embodiments, the method 1300 may include increasing 1312 the fine code if a coarse code is odd. Increasing 1312 the fine code may be based on determining 1320 whether the fine code is not 8. Further, determining 1320 whether the fine code is not 8 may be based on determining 1322 whether to increment or decrement the delay (if the coarse code is odd). The method 1300 may further include decreasing 1314 the fine code if the coarse code is even. In some embodiments, decreasing 1314 the fine code may be based on determining 1318 whether the fine code is not 0. Further, determining 1318 whether the fine code is not 0 may be based on determining 1324 whether to increment or decrement the delay (if the coarse code is even).

Figure 14:
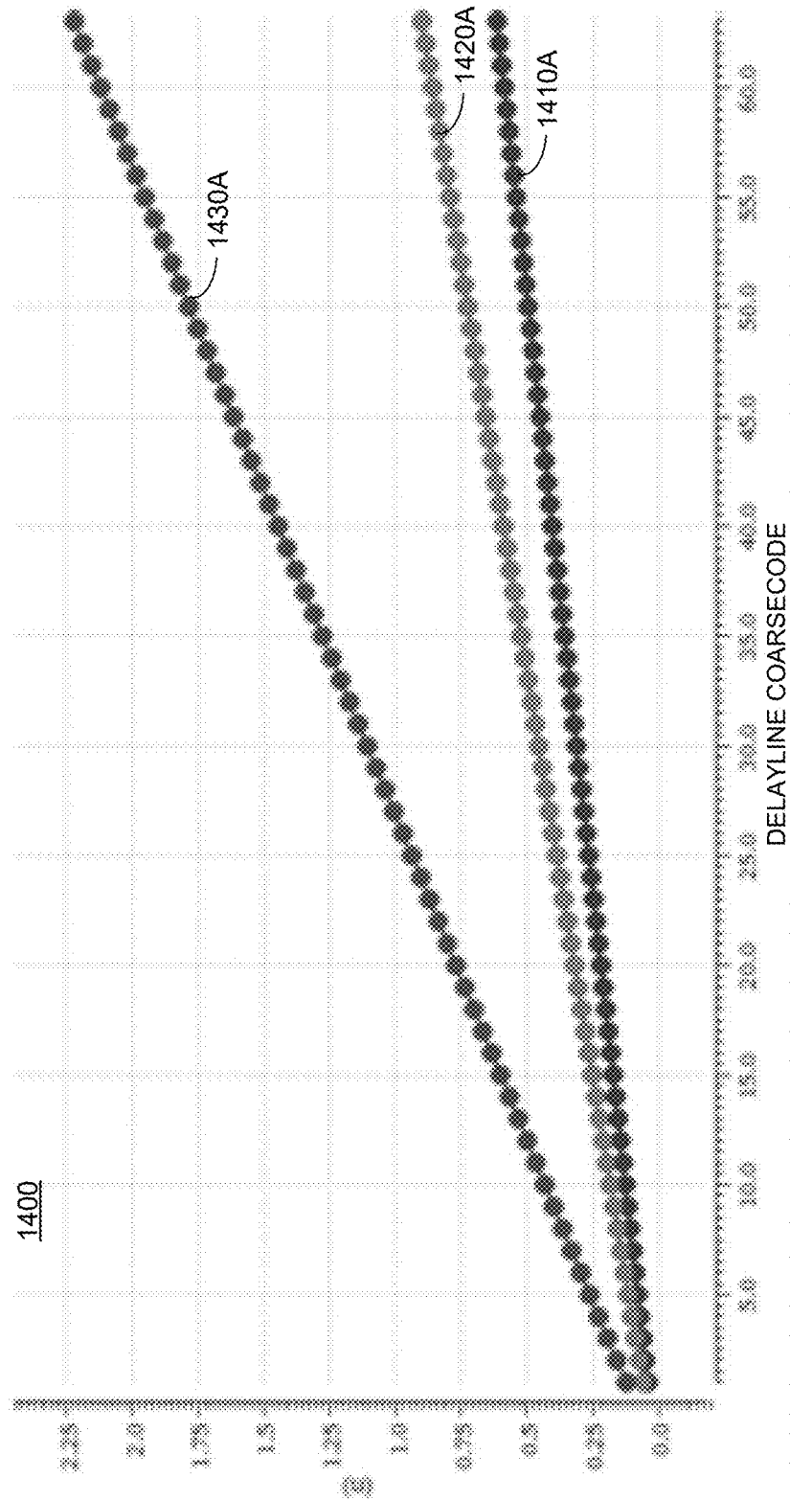
FIG. 14 is a graph illustrating an example output delay according to an embodiment of the present disclosure.

Referring to FIG. 14, a graph illustrating an example output delay according to an embodiment of the present disclosure is shown. The graph 1400 shows an output delay of a delay line with a sweep of coarse delay code. For example, the graph 1400 shows the delay of the delay line between the DQS strobe input 402 and the DQS strobe delayed output 424 as a function of the coarse delay line code 404. The X axis of the graph 1400 represents the coarse delay line code 404. The Y axis of the graph 1400 represents the delay between DQS strobe input 402 and the DQS strobe delayed output 424. The points 1410A illustrate measurements corresponding to a PVT corner 1410B where the delay has been measured. Further, the points 1420A illustrate measurements corresponding to a PVT corner 1420B where the delay has been measured. Additionally, the points 1430A illustrate measurements corresponding to a PVT corner 1430B where the delay has been measured.

Figure 15:
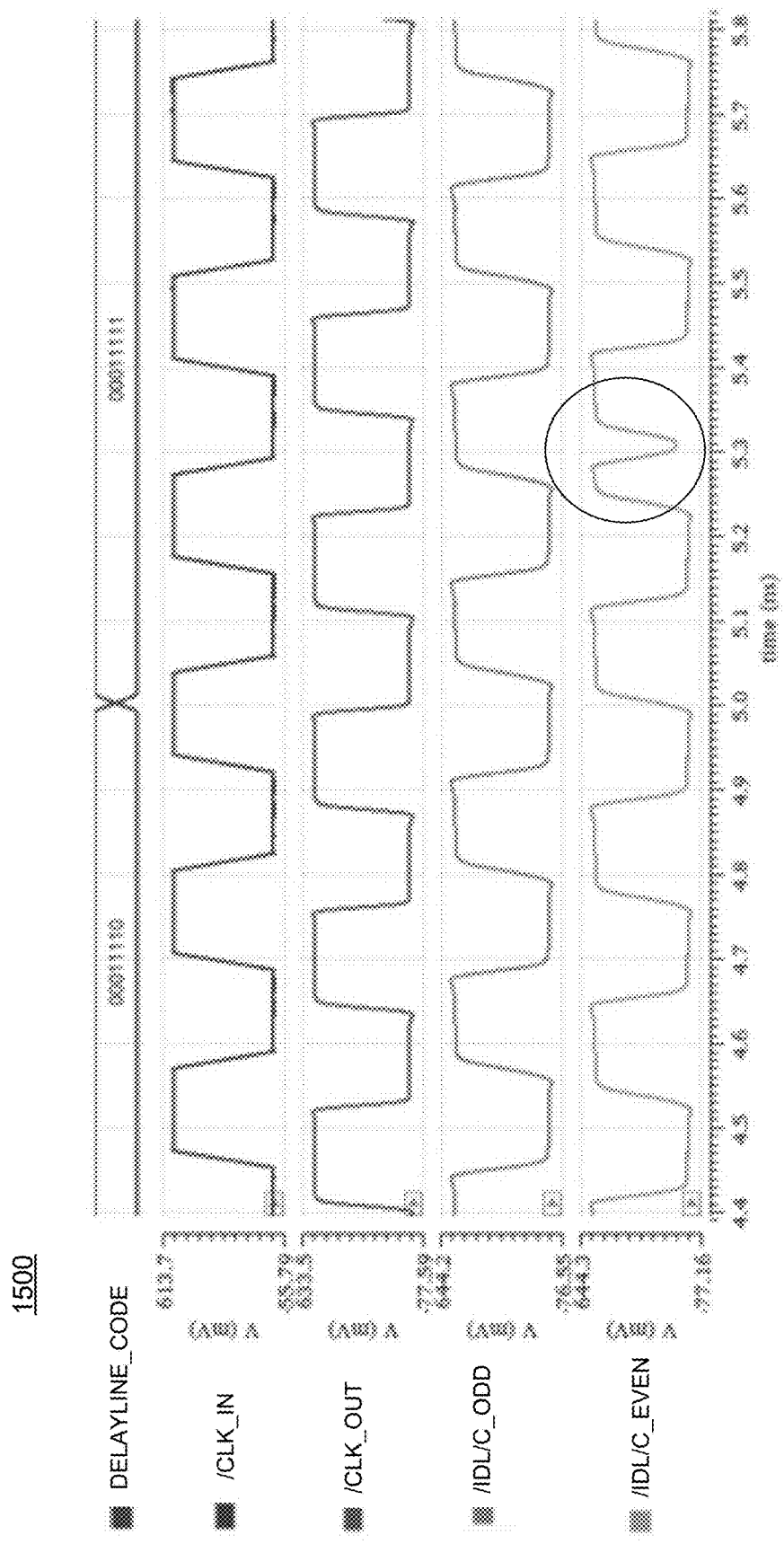
FIG. 15 is a graph illustrating an example delay line output according to an embodiment of the present disclosure.

Referring to FIG. 15, a graph 1500 illustrating an example delay line output according to an embodiment of the present disclosure is shown. /CLK_IN in the graph 1500 represents the DQS strobe input 402. /CLK_OUT in the graph 1500 represents the DQS strobe delayed output 424. /IDL/C_EVEN in the graph 1500 represents the C_EVEN clock path 406 and /IDL/C_ODD represents the C_ODD clock path 408. DELAYLINE_CODE in the graph 1500 represents the coarse delay line code 404. The graph 1500 shows a delay line output (voltage) when switching the coarse delay line code from 0'b00011110 to 0'b00011111. As the fine delay code may be set to 0'd0, all the legs of fine delay interpolator may be switched based on the C_ODD clock input. As shown, switching delay line code from 0'b00011110 to 0'b00011111 causes a glitch on the C_EVEN clock path 406. Since fine delay line code is set to 0, a glitch (e.g., at near 5.3 ns) on C_EVEN clock path 406 does not cause a glitch on the DQS strobe delayed output 424 (/CLK_OUT).

Figure 16:
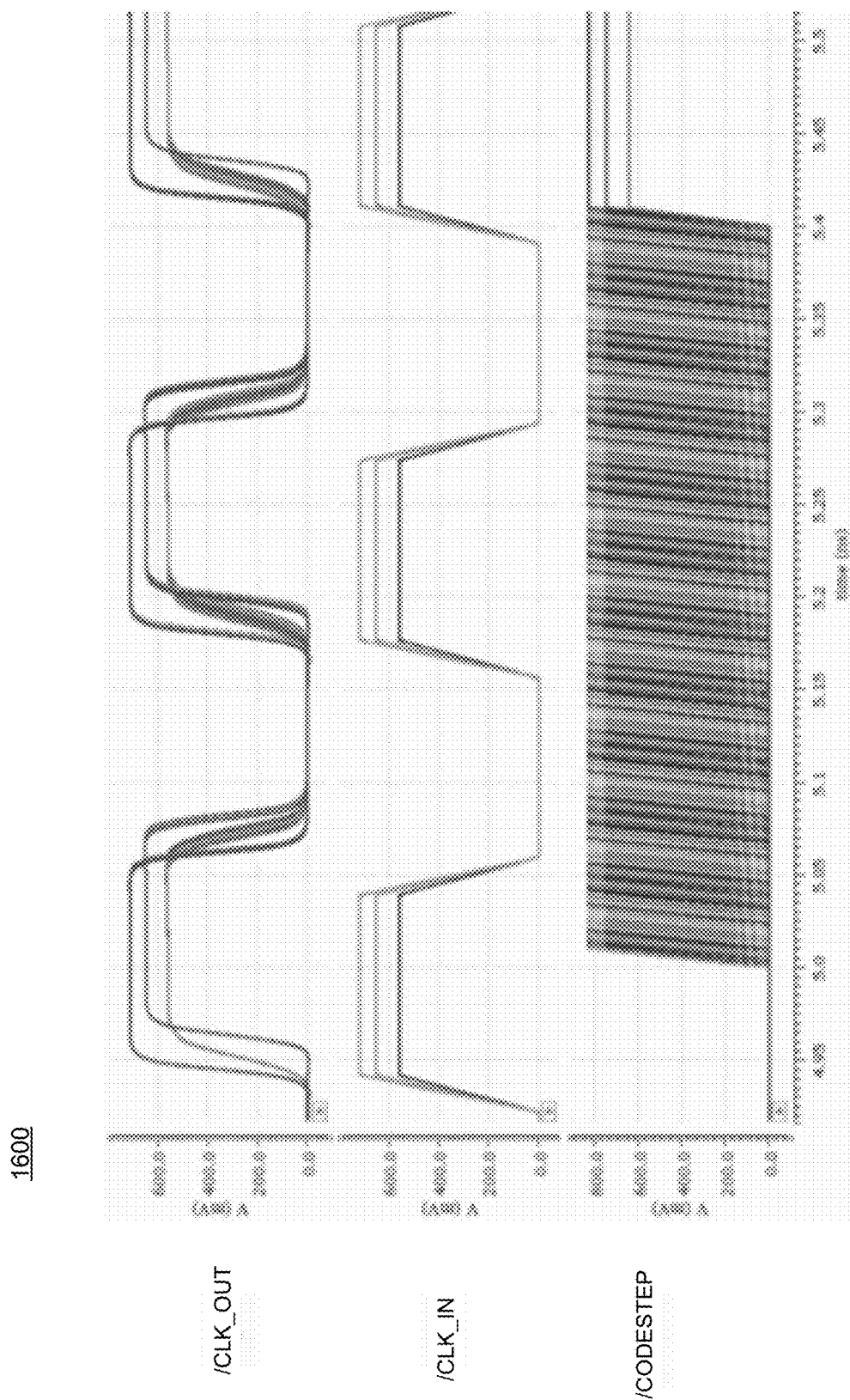
FIG. 16 is also a graph illustrating an example delay line output according to an embodiment of the present disclosure.

Referring to FIG. 16, a graph illustrating another example delay line output according to an embodiment of the present disclosure is shown. In the graph 1600 /CLK_IN represents the DQS strobe input 402 and /CLK_OUT represents the DQS strobe delayed output 424. When /CODESTEP is 0, the fine delay code 422 is 0 and when /CODESTEP is 1, the fine delay code 422 is 8. As can be seen in the graph 1600, switching the fine delay code 422 from 0 to 8 does not cause a glitch on /CLK_OUT (DQS strobe delayed output 424).

Figure 17:
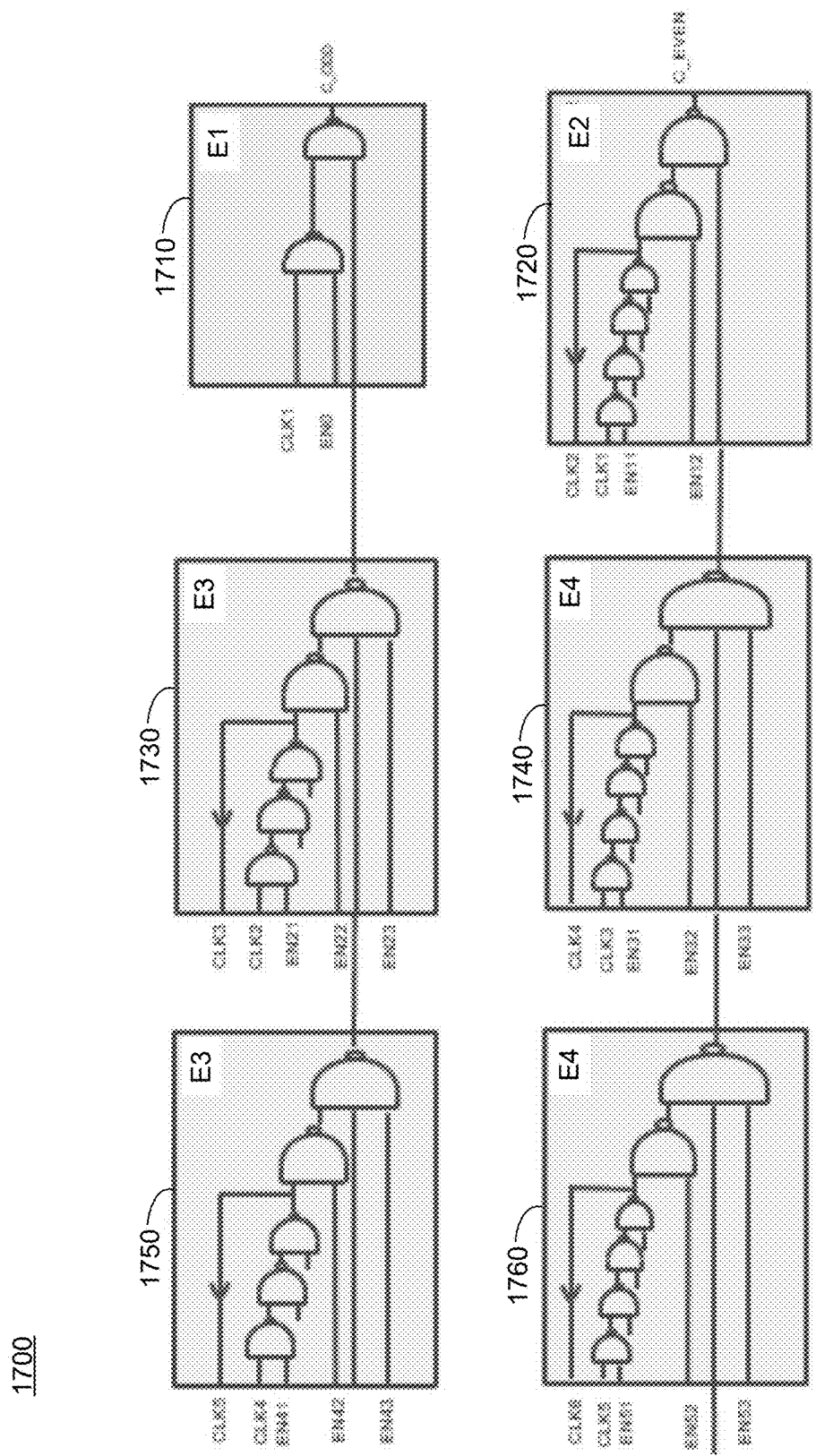
FIG. 17 is also a diagram showing an example coarse delay line structure according to an embodiment of the present disclosure.

Referring to FIG. 17, an example coarse delay line structure 1700 according to an embodiment of the present disclosure is shown. In some embodiments, the coarse delay line 410 may incorporate a structure similar to the coarse delay line structure 1700 and may include four types of delay cells (e.g., E1, E2, E3, and E4) to form a coarse delay line. The coarse delay line structure 1700 may include 4 NAND gates of resolution and thus the step size of the coarse delay line may be a delay of 4 NAND gates. The delay line cell types E1 and E2 may be the first and second instances (shown as delay cell 1710 and delay cell 1720, respectively) of the coarse delay line (e.g., coarse delay line 410). The third and fourth instances (shown as delay cell 1730 and delay cell 1740, respectively) of the coarse delay line (e.g., coarse delay line 410) may be delay line cell types E3 and E4. The coarse delay line structure 1700 may be extended further by adding more delay cell types E3 and E4 (e.g., shown as delay cell 1750 and delay cell 1760, respectively).

Figure 18:
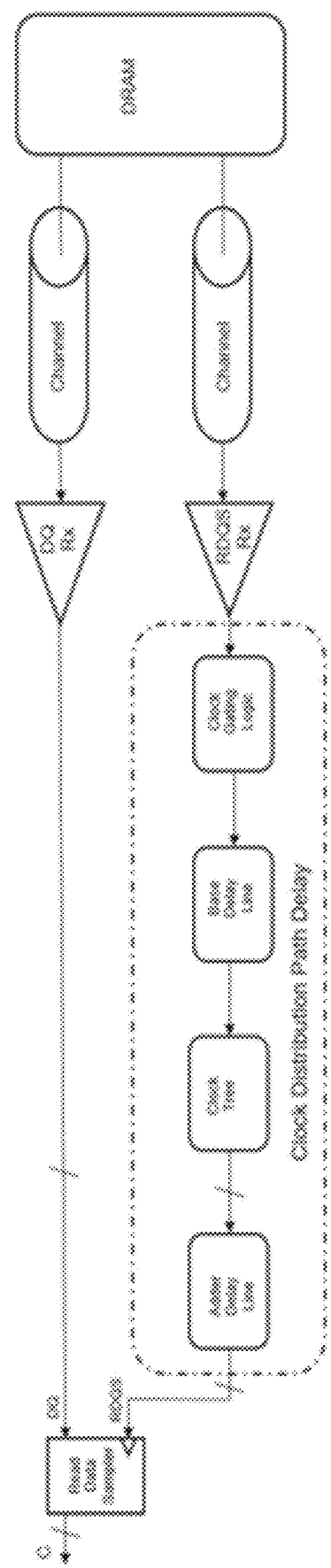
FIG. 18 is a diagram showing an example digitally controlled delay line according to an embodiment of the present disclosure.

Referring to FIG. 18, an example digitally controlled delay line structure 1800 according to an embodiment of the present disclosure is shown. In high-speed LP/DDRx systems, the Clock/Strobe (RDQS) needs to be positioned accurately with respect to DQ in order to sample the data correctly. Digitally controlled delay lines (DCDL) are needed in the clock path to vary the position of RDQS with respect to DQ, however, delay lines are not used in existing systems in the DQ path to avoid PPA overhead. Since the clock distribution path delay is much higher as compared to DQ path delay, PHY requires multiple UIs of early RDQS from DRAM. The clock distribution path delay may be on the order of multiple UIs. The Joint Electron Device Engineering Council (JEDEC), for example, specifies a provision for a maximum of 6UI early DQS. Early RDQS causes relative/accumulated jitter between DQ-RDQS. As the clock path distribution delay increases, relative jitter also increases. The presence of high jitter may cause system level timing budget violations and this problem may be more severe at higher data rates.

Accordingly, embodiments included herein provide a clock distribution path with minimum intrinsic propagation delay and jitter. This ensures an improved timing margin at the system level, which may be required at higher data rates. Delay line codes may be updated whenever there is voltage and temperature (VT) drift in the PHY. In existing approaches, traffic had to be stopped when delay line codes were updated, or glitches and a loss of system throughput would result. Embodiments included herein provide a clocking scheme that includes a delay line architecture whose output does not glitch when the delay line codes are updated even with the system traffic on.

Referring now to FIGS. 19-42, embodiments of the present disclosure directed towards efficient clocking structures for high-speed systems using hybrid digital delay lines are shown. Embodiments included herein provide a single path digitally controlled coarse delay line which is capable of glitch-free on the fly coarse delay code updates. When compared to the best-known glitch-free digitally controlled delay line architectures, the teachings of the present disclosure have been shown to reduce power consumption by approximately 20% and area by 30%. The clocking architecture described herein may incorporate both a single path digitally controlled delay line (SP-DCDL) along with a dual path digitally controlled delay line (DP-DCDL) to generate a new structure, referred to herein as a hybrid digitally controlled delay line (H-DCDL). In addition to the power and area advantages discussed above embodiments included herein may were shown to reduce insertion delay by approximately 23%, total path jitter by 20%, accumulation jitter for RX is significantly reduced, and the overall clock path power was reduced by approximately 8% for 0-code and approximately 20% for trained delay code. Embodiments included herein may incorporate unique anti-aging circuitry to compensate for duty cycle distortion (DCD) caused by bias temperature instability (BTI).

Figure 19:
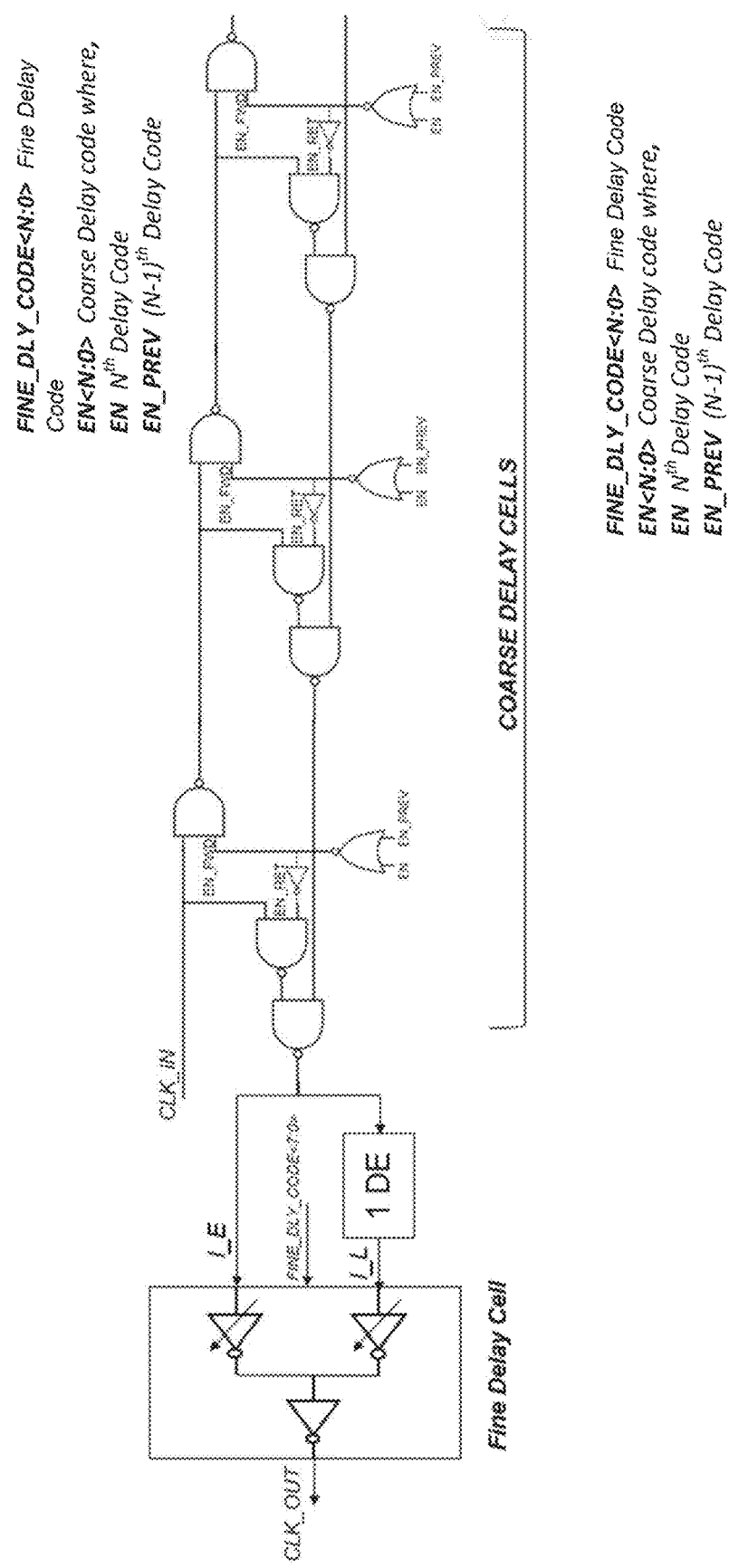
FIG. 19 is a diagram showing an example single path, digitally controlled delay line according to an embodiment of the present disclosure.
Figure 20:
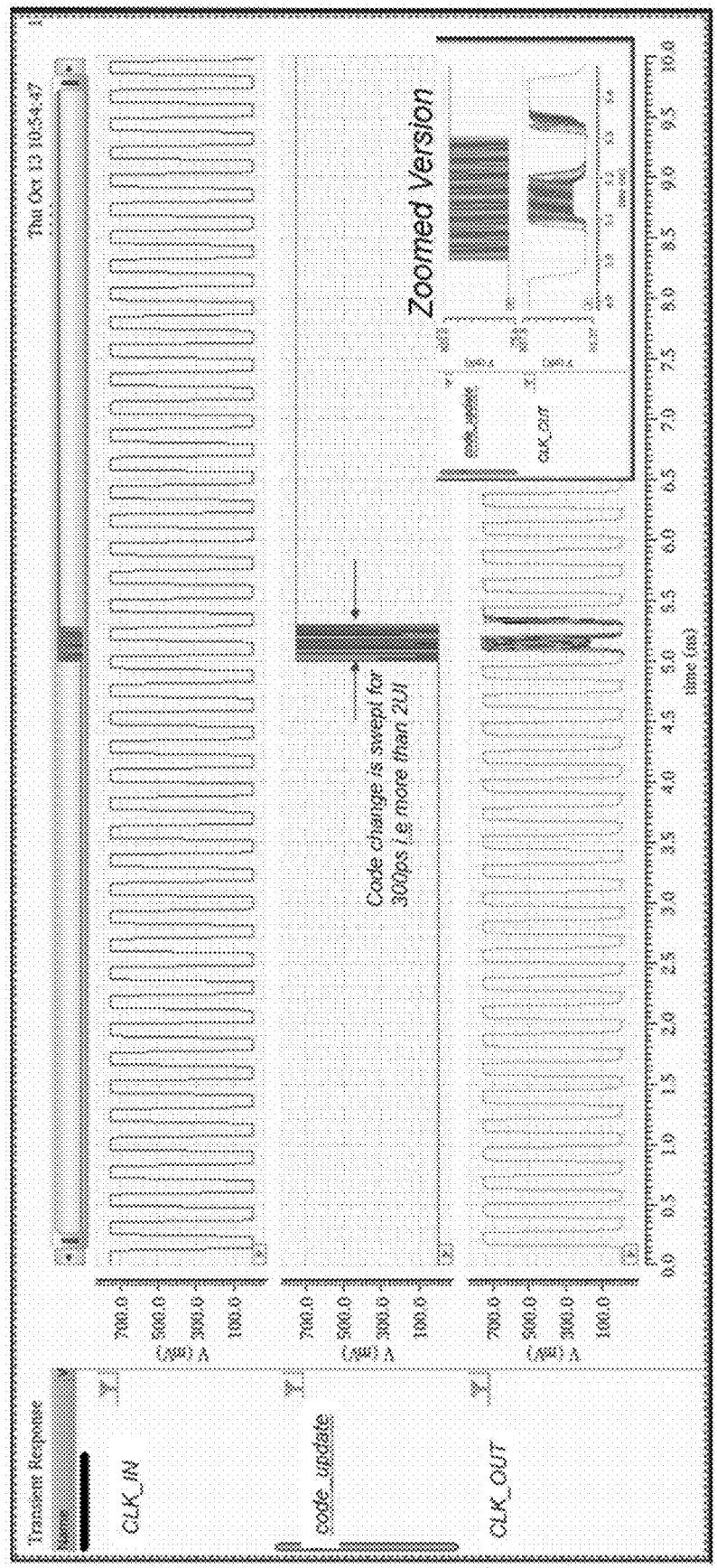
FIG. 20 is a graph showing an example glitch issue simulation result.

Referring now to FIG. 19, a diagram showing an example single path, digitally controlled delay line structure 1900 according to an embodiment of the present disclosure is shown. In this example, one hot encoding was used for delay codes. However, this configuration may suffer from glitches during a code update, hence on-the-fly code updates cannot be performed. The glitch may occur for both coarse and fine code updates. COARSE_CODE (EN) is one hot encoded and FINE_CODE is binary coded. In this example, there may be a glitch issue during the coarse code update. Whenever coarse codes are increased, additional NAND gates are added. Internal nodes of newly added NAND gates can have different logic polarity than an input clock. Hence, the addition of NAND gates to existing delay lines may cause a glitch. Whenever coarse codes are reduced, NAND gates are removed from existing delay lines, which does not cause a glitch. There may also be a glitch issue during a fine code update. The coarse delay line has a single output, and a delayed clock is generated using 1 DE. In FIG. 18, Clock input I_E is always earlier than I_L by 2 NAND gates at the input of the fine delay cell. Whenever the fine code transitions from I_L to I_E, i.e., late clock to early clock, there will be a glitch. Due to the glitches, on-the-fly code updates cannot be performed. As such data traffic must be stopped every time there is a code update needed, which severely limits the throughput of the system. FIG. 20 is a graph showing an associated glitch issue simulation result. This shows that during the code update, the conventional SP-DCDL glitches, hence the on-the-fly code update cannot be performed.

Figure 21:
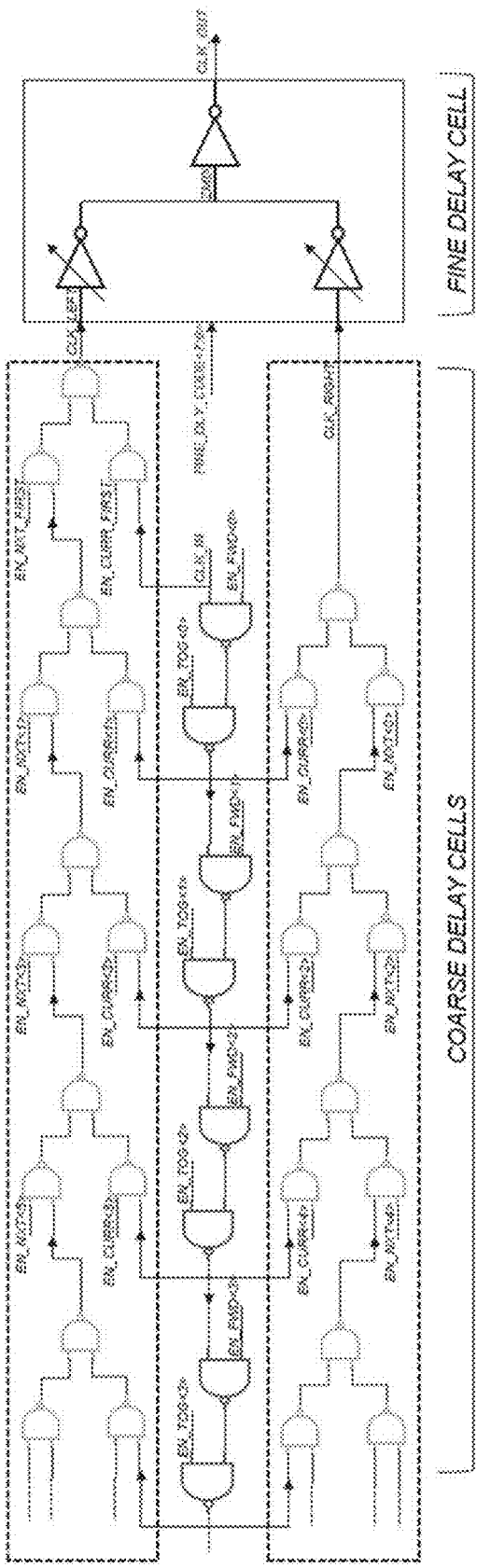
FIG. 21 is a diagram showing an example dual path, digitally controlled delay line according to an embodiment of the present disclosure.
Figure 21:
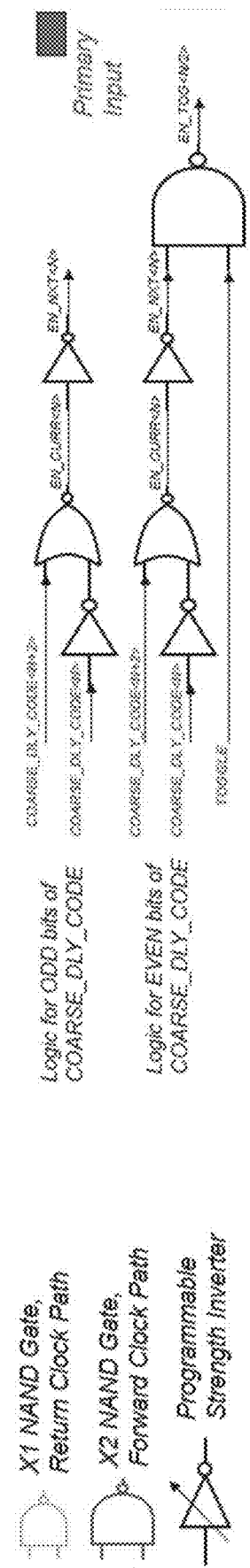

Referring now to FIG. 21, a diagram showing an example dual path, digitally controlled delay line structure 2100 according to an embodiment of the present disclosure is shown. In order to solve the on-the-fly glitch issue discussed above, a dual path DCDL (DP-DCDL) may be used. DP-DCDL has two clock paths named CLK_LEFT and CLK_RIGHT in the diagram. While code updates happen on the CLK_LEFT path, the CLK_RIGHT path is chosen using FINE_DLY_CODE. Similarly, while code updates happen on the CLK_RIGHT path, the CLK_LEFT path may be chosen using FINE_DLY_CODE. Also, in order to avoid any glitch due to inter bit skew of delay codes, thermometric delay codes may be used for both COARSE_CODE and FINE_CODE. This configuration suffers from higher power consumption due to its dual path configuration. Power is especially critical in LPDDRx systems. Power for delay lines is supplied by the regulator in order to obtain lower power supply induced jitter (PSIJ) so high-power consumption by delay lines adversely affects the power supply rejection ratio (PSRR) of the regulator. The configuration of FIG. 21 may have a higher intrinsic delay since each delay line compulsorily needs to have a fine delay cell. In FIG. 21, either CLK_LEFT is delayed compared to CLK_RIGHT or CLK_RIGHT is delayed compared to CLK_LEFT based on COARSE_DLY_CODE and the delay is equal to a 2 NAND gate delay. In order to obtain finer delay resolution, fine delay cell interpolates between CLK_LEFT and CLK_RIGHT. Each delay line needs a fine delay cell to generate a single ended output CLK_OUT using CLK_LEFT and CLK_RIGHT. If the overall clock path needs three delay lines as base, adder and rise/fall delay line, we will have to use three fine delay cells. Each fine delay cell adds intrinsic delay in the clock path, making the overall intrinsic clock distribution path delay higher. CLK_IN to C_LEFT and CLK_IN to C_RIGHT path has non-common delay elements. Non-common delay elements are highlighted in the box. Local Monte Carlo mismatch between non-common elements introduces non-linearity in the delay line. Non-common elements increase as the delay code increases leading to higher non-linearity.

Figure 22:
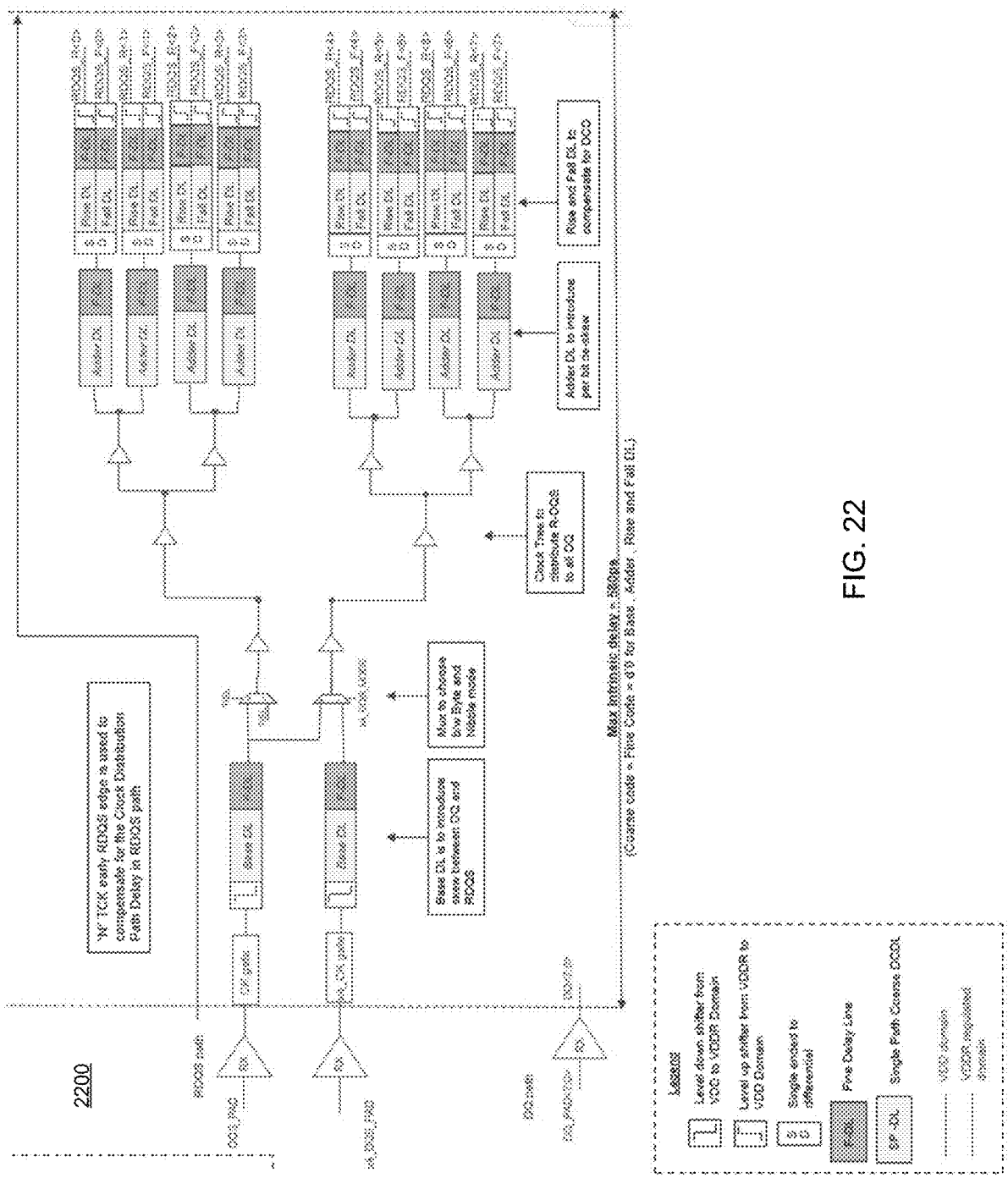
FIG. 22 is an example of PHY level clocking using dual path, digitally controlled delay line according to an embodiment of the present disclosure.

Referring now to FIG. 22 an example of PHY level clocking 2200 using dual path, digitally controlled delay line according to an embodiment of the present disclosure is shown. This example shows PHY read clock path having a CK Gate, base delay line, clock tree, adder delay line, and Rise/Fall delay line, each of which is discussed in further detail below. The "CK Gate" may refer to a clock gating cell, used to gate the clock when not in use. The "base delay line" may be used to compensate for skew between DQ and DQS. The "clock tree" may be used to distribute input clock to all the DQ. The "adder delay line" may be used to compensate for inter-bit skew between different DQ. The "rise/fall delay line" may be used to compensate for duty cycle distortion (DCD) of DQS. Some issues in conventional clocking architecture using DP-DCDLs include high intrinsic delay, higher clock path jitter, and higher power consumption.

Figure 23:
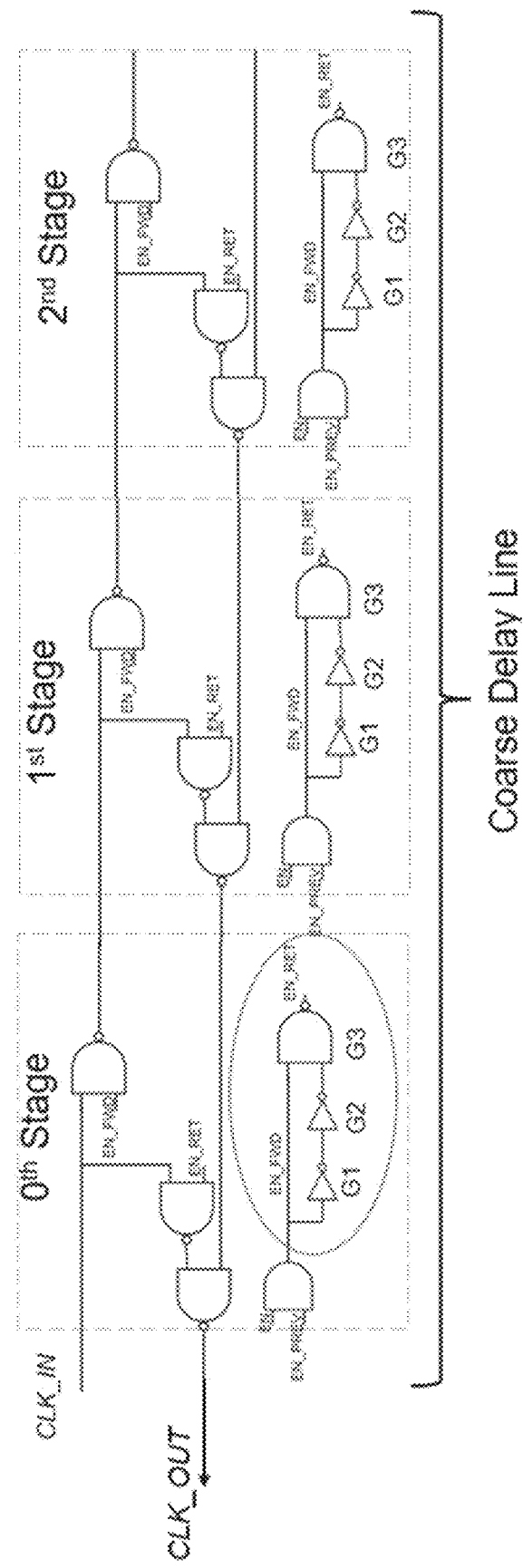
FIG. 23 is a diagram showing an example single path, digitally controlled delay line according to an embodiment of the present disclosure.

Referring now to FIG. 23 a diagram showing an example single path, digitally controlled delay line 2300 according to an embodiment of the present disclosure is shown. The SP-DCDL requires lower power and lower area than existing approaches. There is no issue of non-common elements hence better process mismatch performance. However, this approach suffers from a glitch issue during on-the-fly code updates for both coarse and fine updates. The DP-DCDL has no glitch issue during the on-the-fly code update in either coarse or fine updates. However, this approach suffers from higher intrinsic delay, higher jitter, higher non-linearity, and higher area and power requirements.

Embodiments included herein are SP-DCDL and are capable of on-the-fly coarse delay codes updates. As such, all the benefits of SP-DCDL may be utilized and the glitch issue is also eliminated. Embodiments of the SP-DCDL described herein may work on thermometric coarse and fine delay codes, in order to avoid glitches due to inter bit skew. The SP-DCDL may be used as a coarse delay line for both the base and adder. As such, the fine delay line may be eliminated for base and adder delay lines, hence the intrinsic delay of clock path is reduced. Reduced intrinsic delay results into improved clock path jitter and receiver accumulation jitter performance. Overall clock path mismatch performance, linearity, area, and power may all be improved.

Referring again to FIG. 23, an analysis of SP-DCDL shows that a glitch caused during coarse code update can be avoided if newly added NAND gates in the forward path are enabled first before disabling return path ("make before break"). In order to do so, EN_RET is delayed compared to EN_FWD using the encircled logic shown in FIG. 23. In this example, G1 and G2 are inverters used to delay EN_RET and G3 is a NAND gate, special care must be taken in design for this NAND gate as is discussed in further detail hereinbelow. The make before break strategy is to first enable the forward path before disabling the return path, the G1 and G2 inverter cells are there to ensure it. In operation, during a code increment, EN_PREV=1 and EN transitions from 0→1. First, EN_FWD may transition from 0→1, then EN_RET may transition 1→0 after a two-inverter delay. During code decrement, EN_PREV=1 and EN transitions from 1>0. EN_FWD transitions 1→0 and EN_RET will also transition 0→1 immediately.

Figure 24:
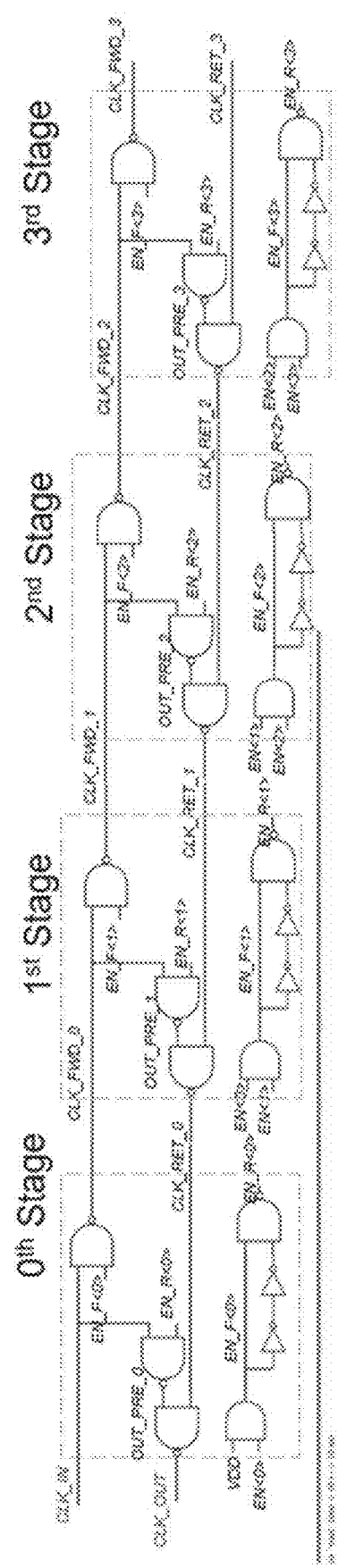
FIG. 24 is a diagram showing an example single path, digitally controlled delay line with code increment according to an embodiment of the present disclosure.
Figure 25:
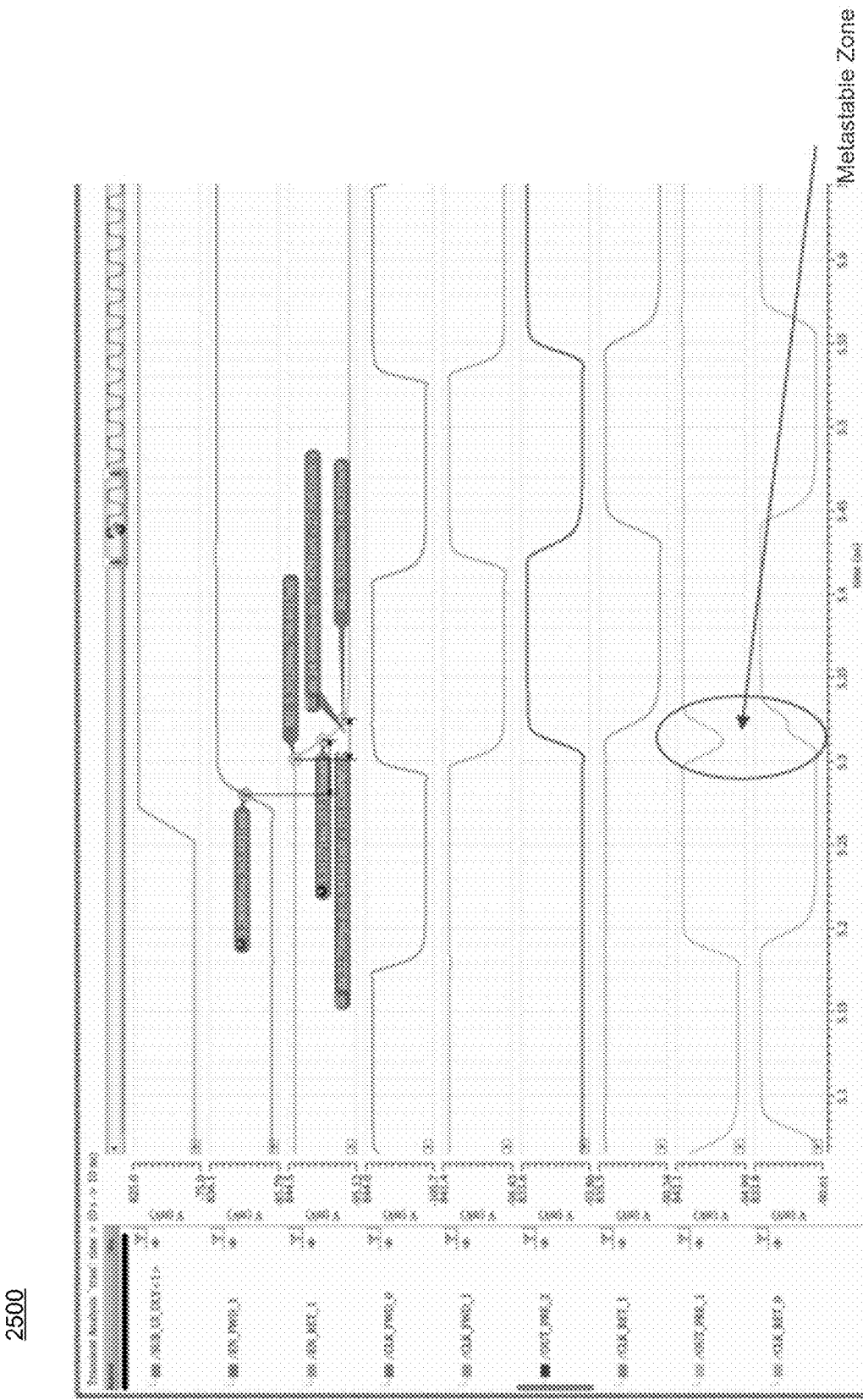
FIG. 25 is a graph associated with the diagram of FIG. 24 according to an embodiment of the present disclosure.

Referring now to FIG. 24, a diagram showing an example single path, digitally controlled delay line with code increment 2400 according to an embodiment of the present disclosure is provided. In this example, the delay code is incremented from 0001 to 0011. EN_F transitions from 0001 to 0011 and EN_R transition from 1110 to 1100. The second stage is added. It should be noted that OUT_PRE_3 is static 0 during this update and CLK_RET_2 is static 1 in order to pass OUT_PRE_2. EN_R<1> transitions 1→0 after 2 INV delay. OUT_PRE_1 is transitioning from 1→0 since EN_R<1> is 1, so, it is inverting CLK_FWD_0. As soon as EN_RET_1 goes to 0, OUT_PRE_1 transitions back to 1. This glitch in OUT_PRE_1 translates to glitch in CLK_RET_0. To mitigate small kinks in CLK around the transition phase, just performing make before break may not be enough, and it may be necessary to slow down the fall transition of EN_RET_1. FIG. 25 is a graph 2500 associated with the diagram of FIG. 24 according to an embodiment of the present disclosure.

Figure 26:
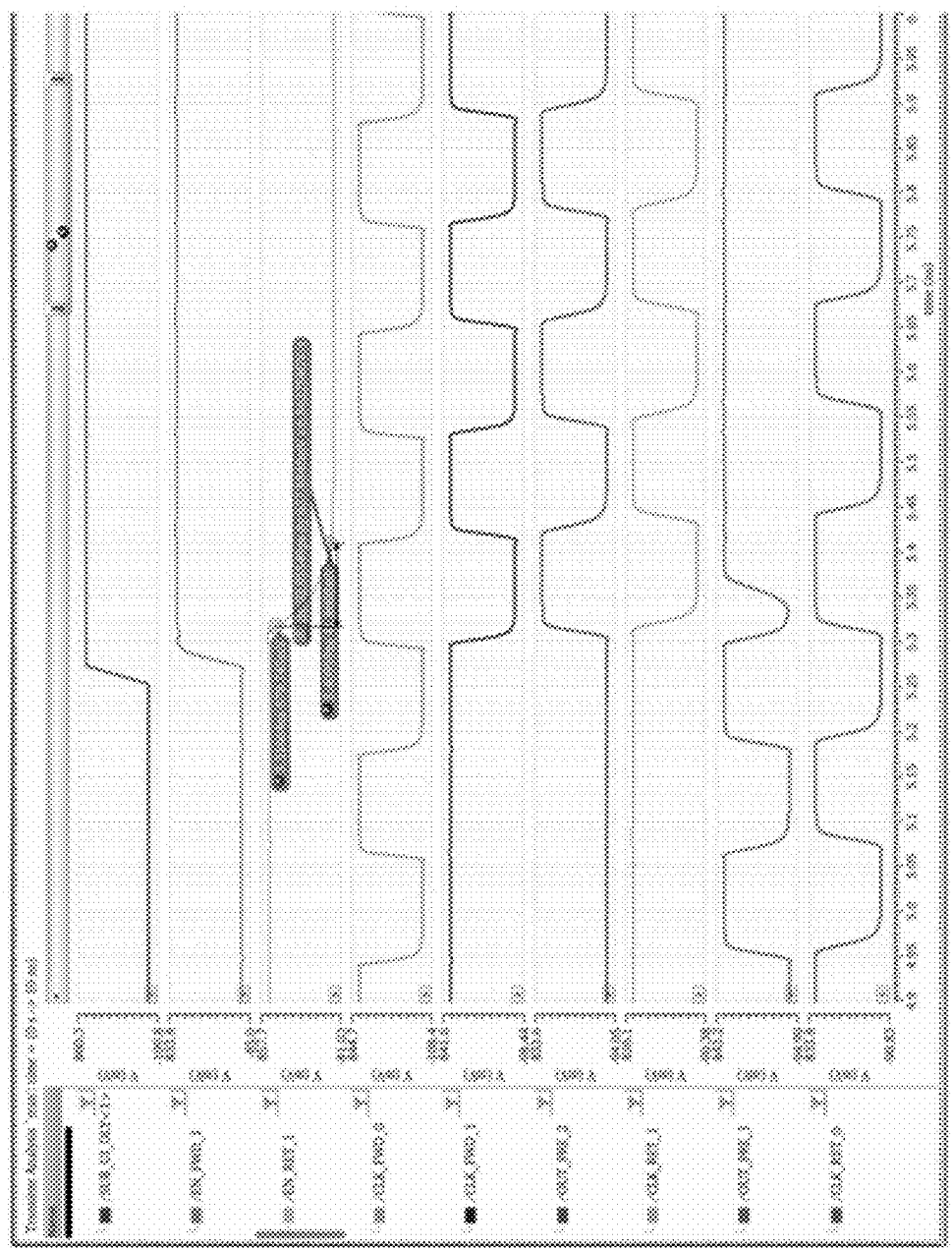
FIGS. 26-29 show graphs of simulation waveforms according to embodiments of the present disclosure.
Figure 27:
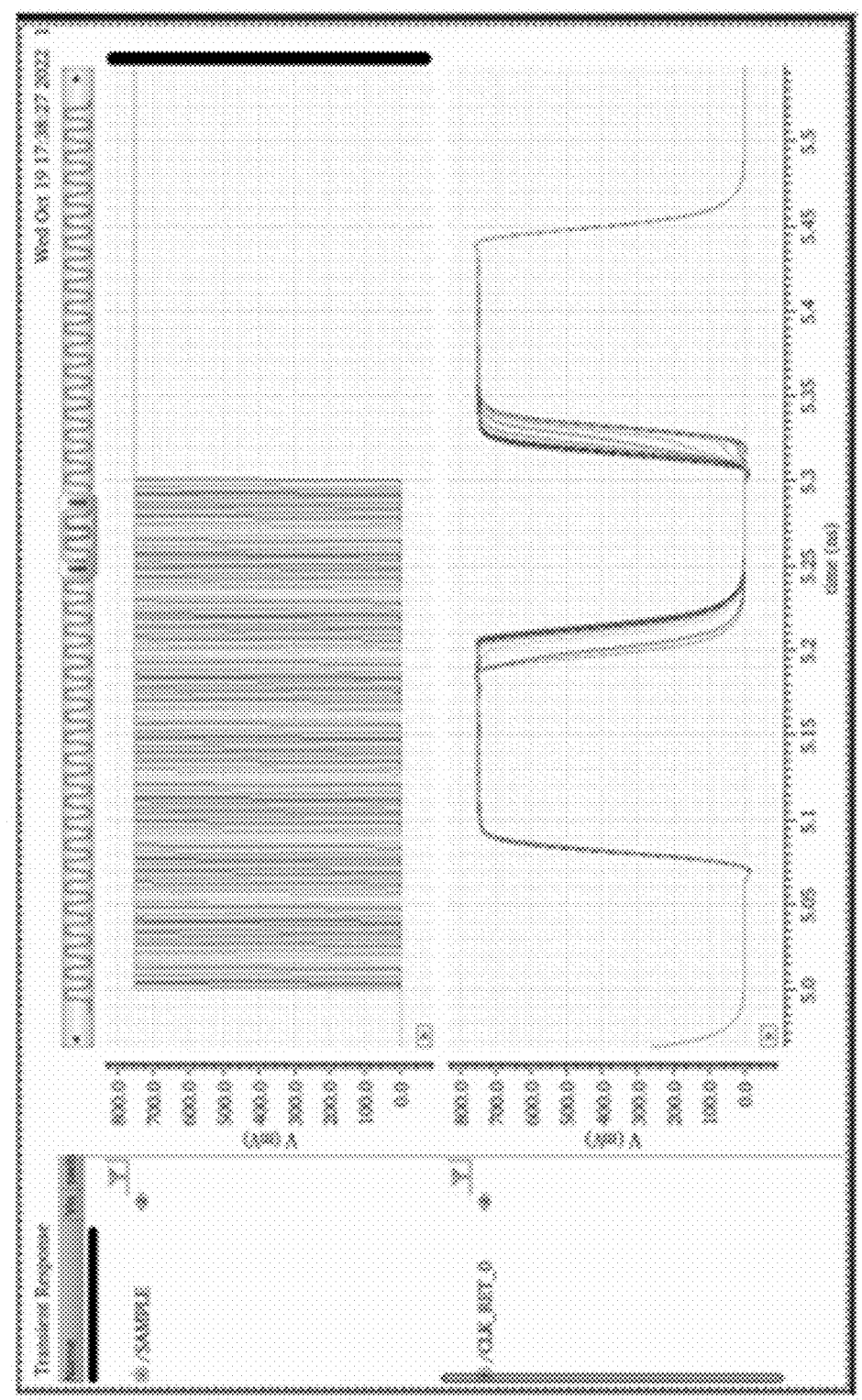
Figure 28:
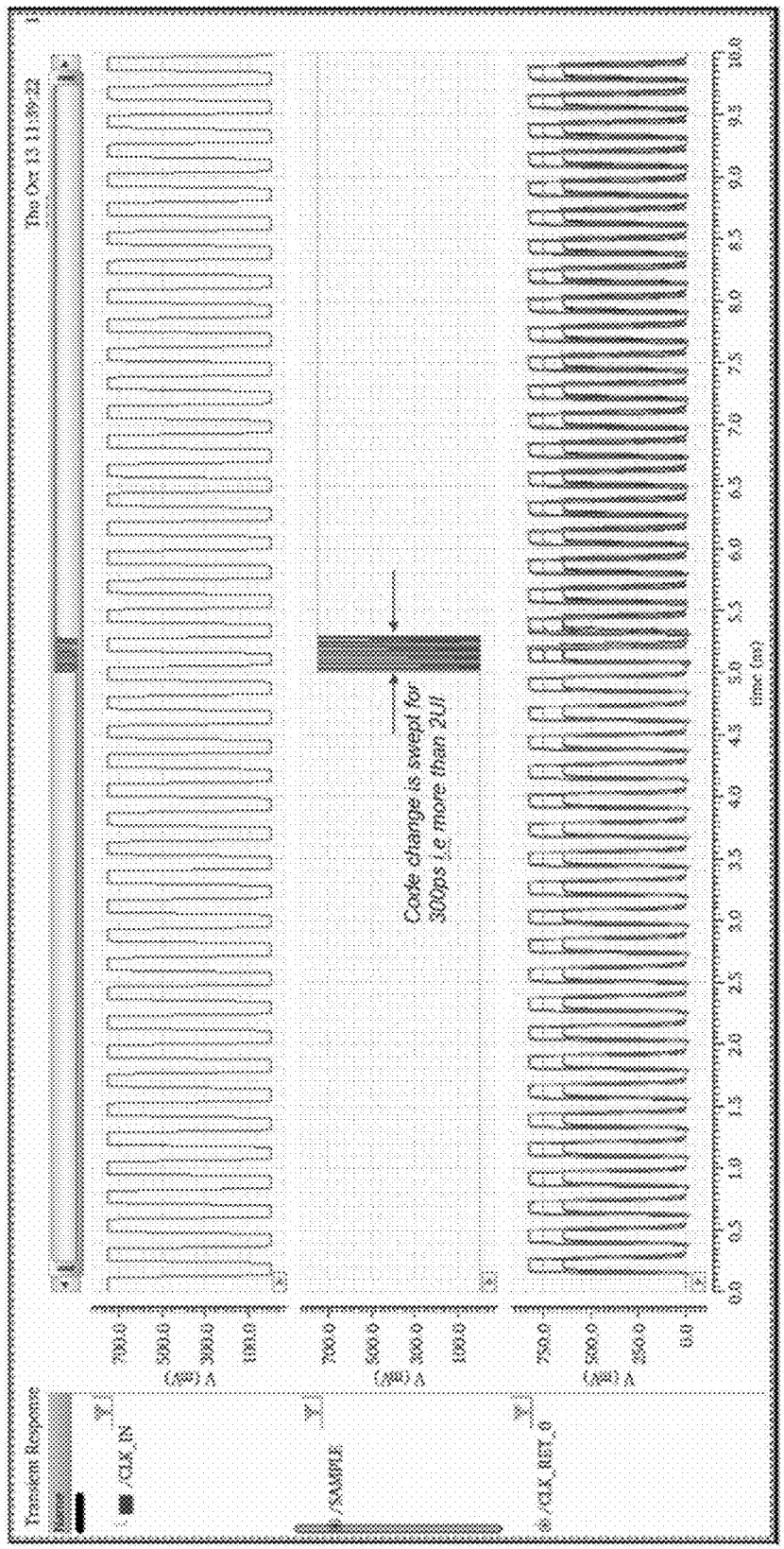
Figure 29:
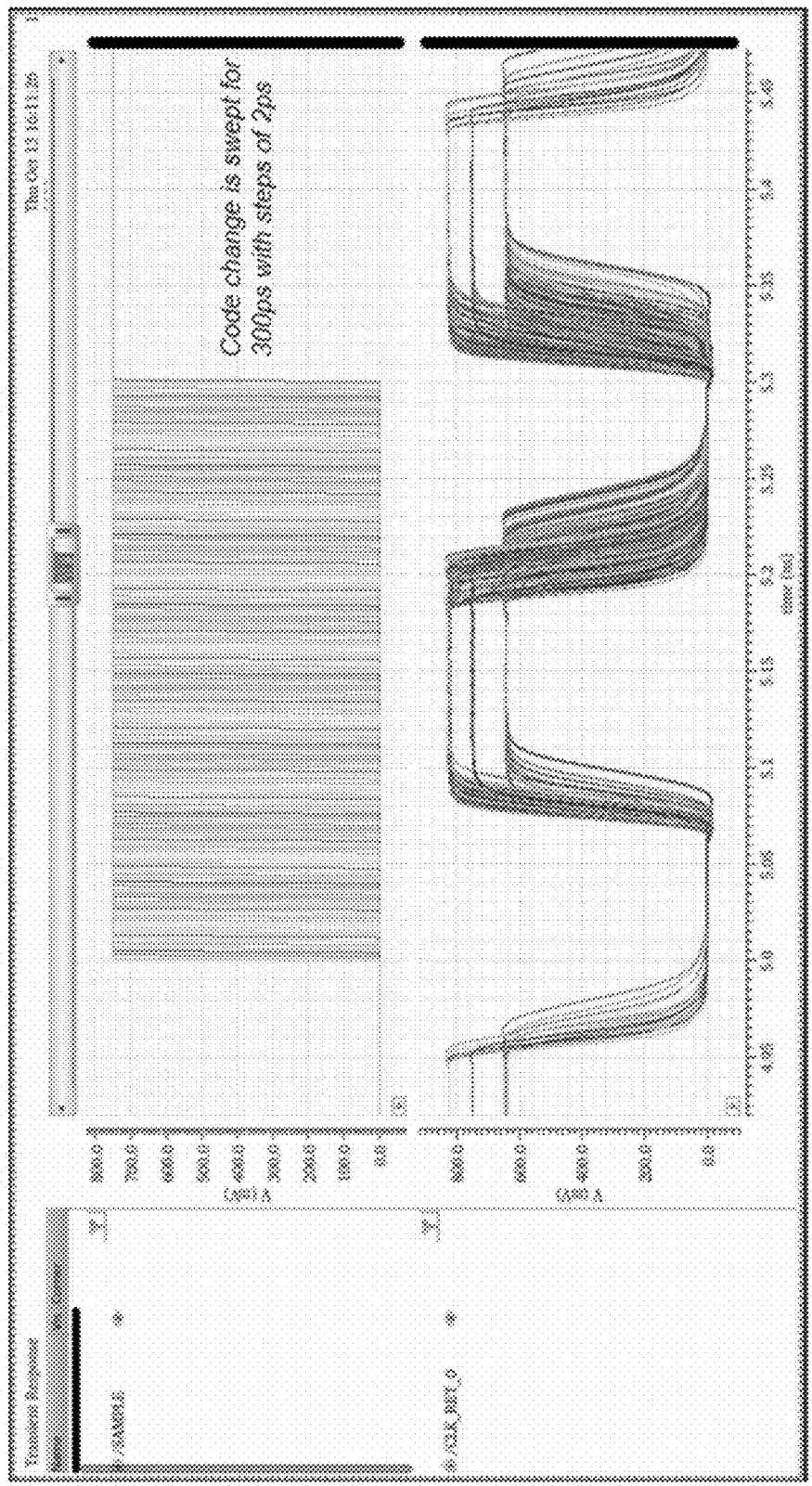

FIGS. 26-29 show graphs of simulation waveforms 2600, 2700, 2800, and 2900 according to embodiments of the present disclosure. FIG. 26-27 show simulation waveforms with reduced fall slew. FIG. 26 shows that small kinks in the CLK during the transition phase can be completely avoided by slowing the fall time of the G3 gate. Still a two-inverter gate delay G1 and G2 may be used between EN_F and EN_R. FIG. 27 shows that multiple samples with reduced fall slew and the two-inverter delay. No kinks are observed around the transition phase. FIG. 28 shows a cross corner code increment simulation waveform and FIG. 29 shows an enlarged version around the code change. There is no glitch observed, hence on-the-fly code update may be performed using the SP-DCDL.

Figure 30:
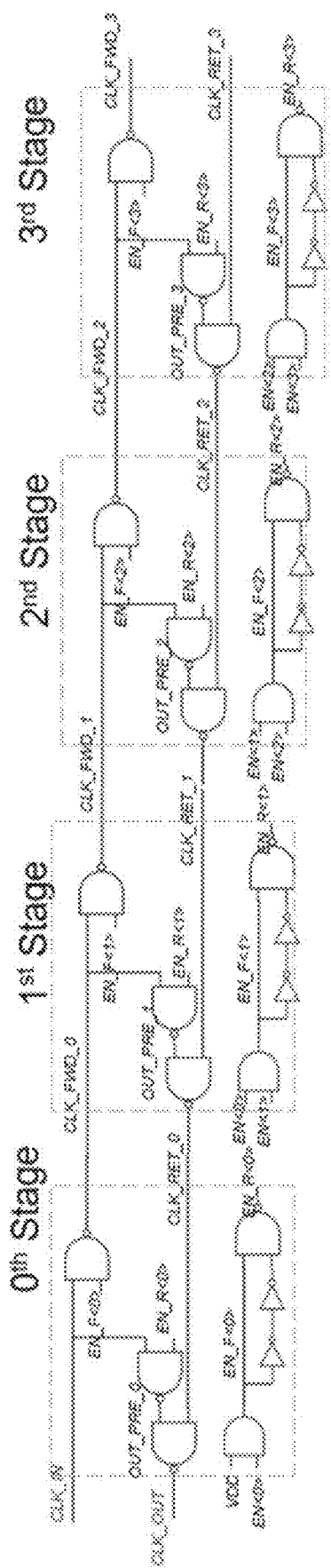
FIG. 30 is a diagram showing an example single path, digitally controlled delay line with code decrement according to an embodiment of the present disclosure.
Figure 31:
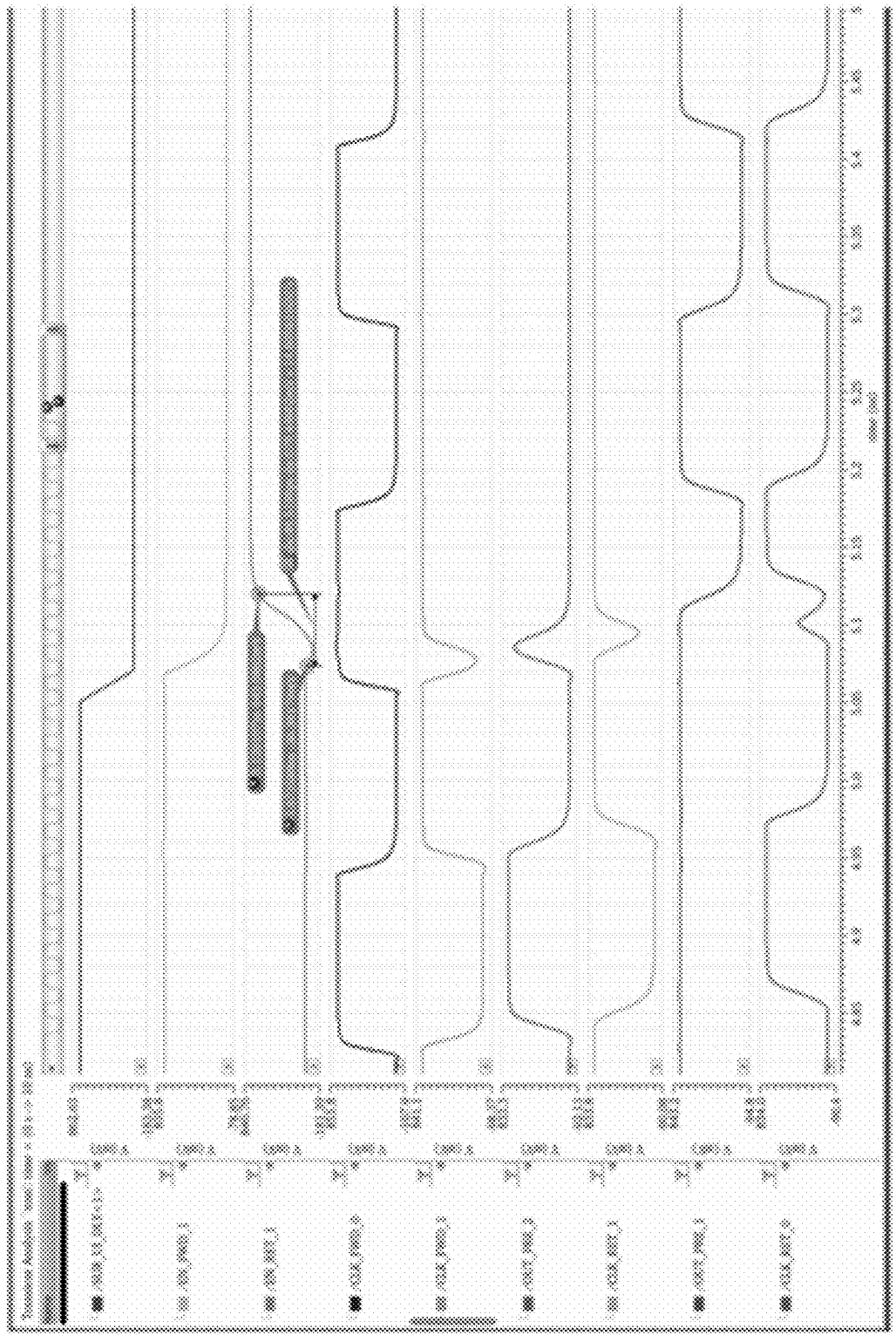
FIG. 31 is a graph associated with the diagram of FIG. 30 according to an embodiment of the present disclosure.

Referring now to FIG. 30, a diagram showing an example single path, digitally controlled delay line with code decrement 3000 according to an embodiment of the present disclosure is shown. In this example, code is decremented from 0011 to 0001, EN_F transitions from 0011 to 0001, and EN_R transition from 1100 to 1110. The second stage may be removed. As soon as EN_F_<1> is disabled, EN_R_<1> should be enabled. But the slow rise of EN_R_<1>, will not let CLK_FWD_0 pass. CLK_RET_0 can glitch. To mitigate small glitches in the CLK around the transition phase, it may be necessary to have a fast rise transition of EN_RET_1. FIG. 31 is a graph 3100 associated with the diagram of FIG. 30 according to an embodiment of the present disclosure.

Figure 32:
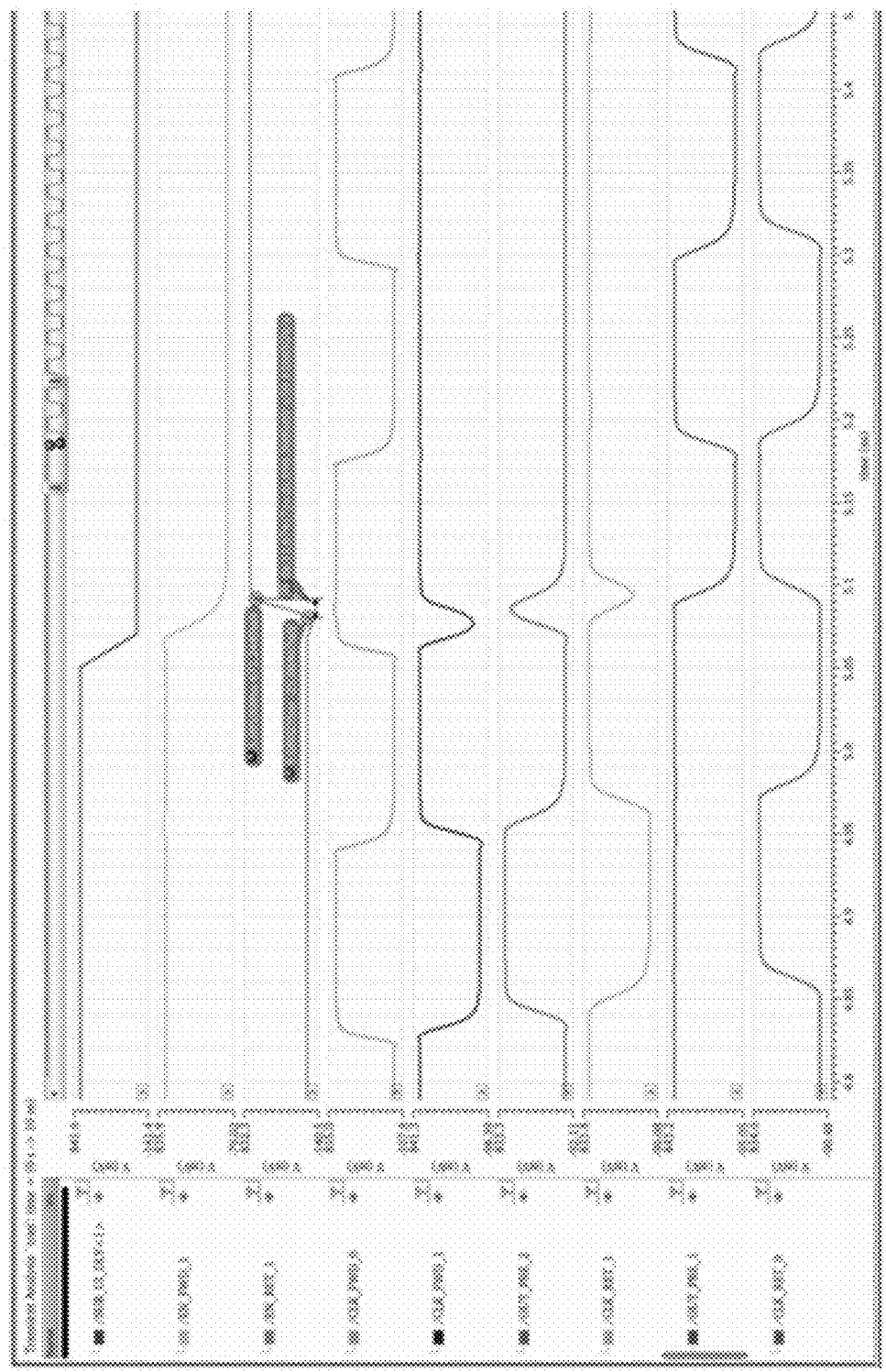
FIGS. 32-35 show graphs of simulation waveforms according to embodiments of the present disclosure.
Figure 33:
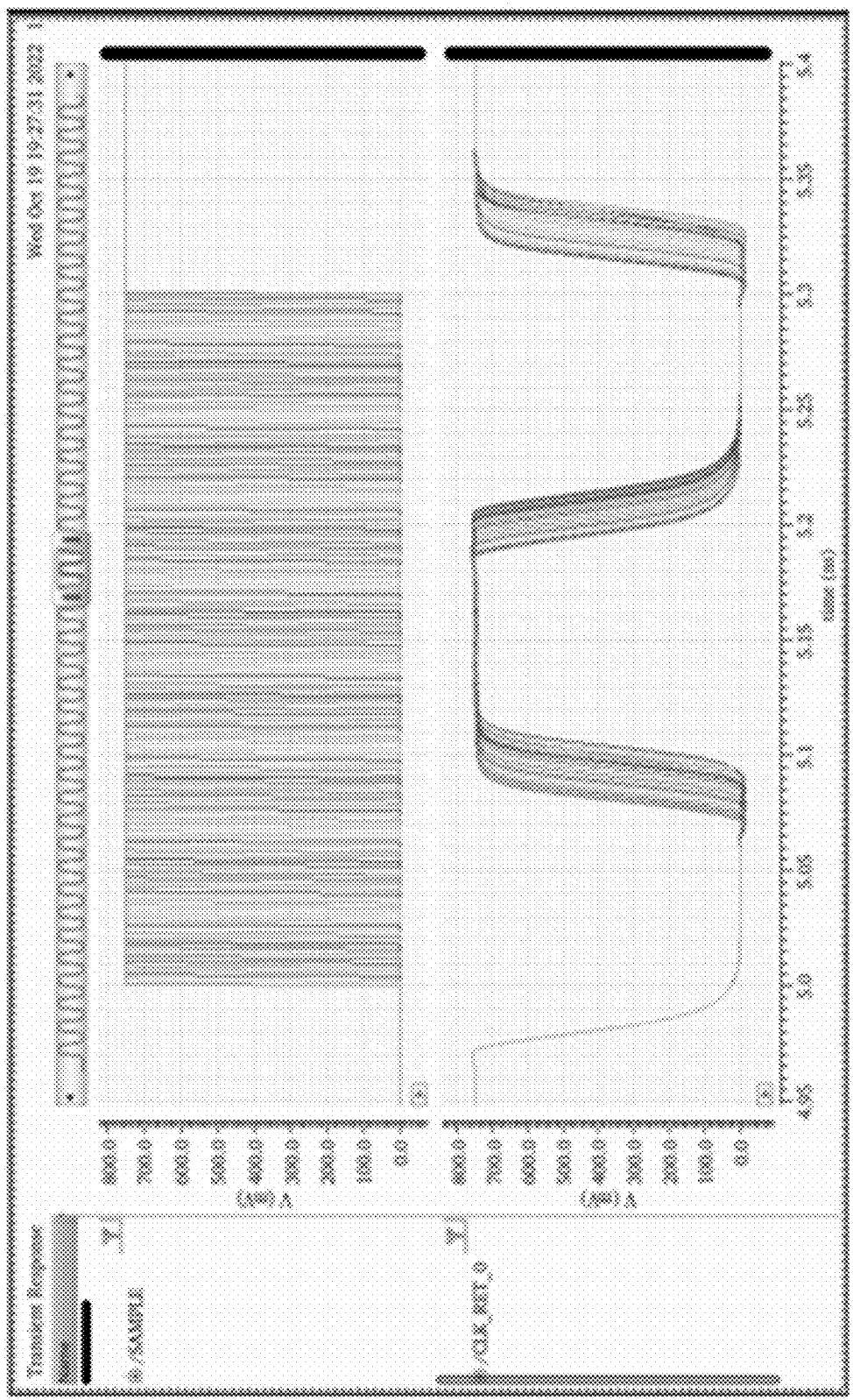
Figure 34:
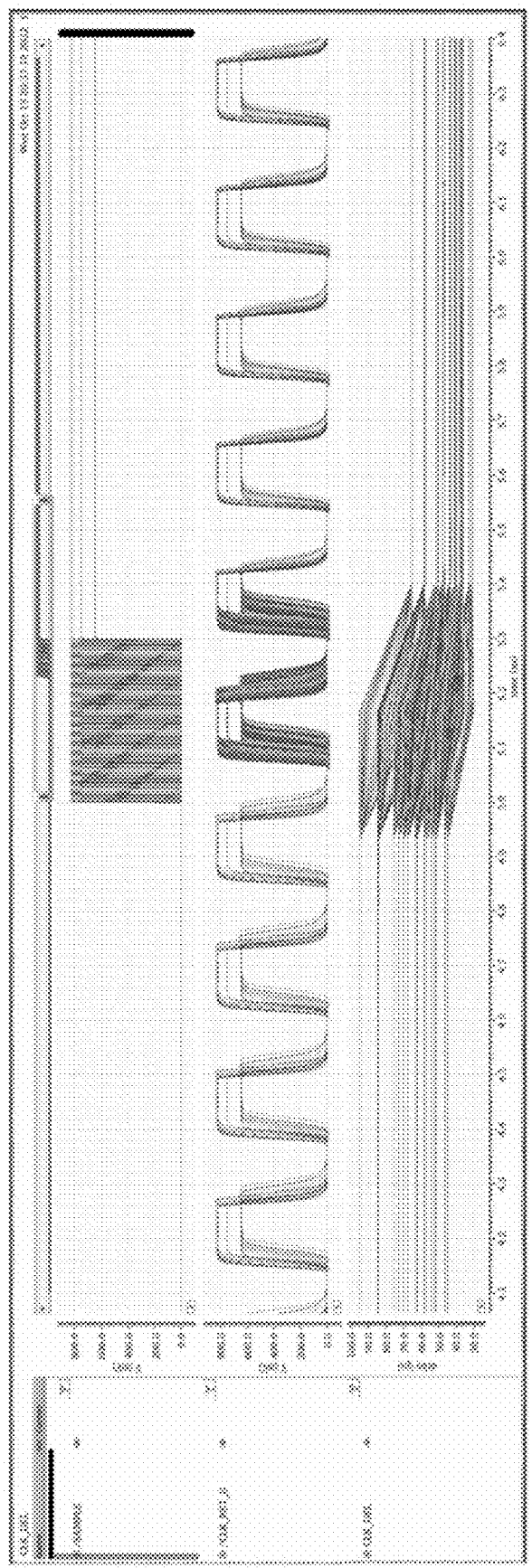
Figure 35:
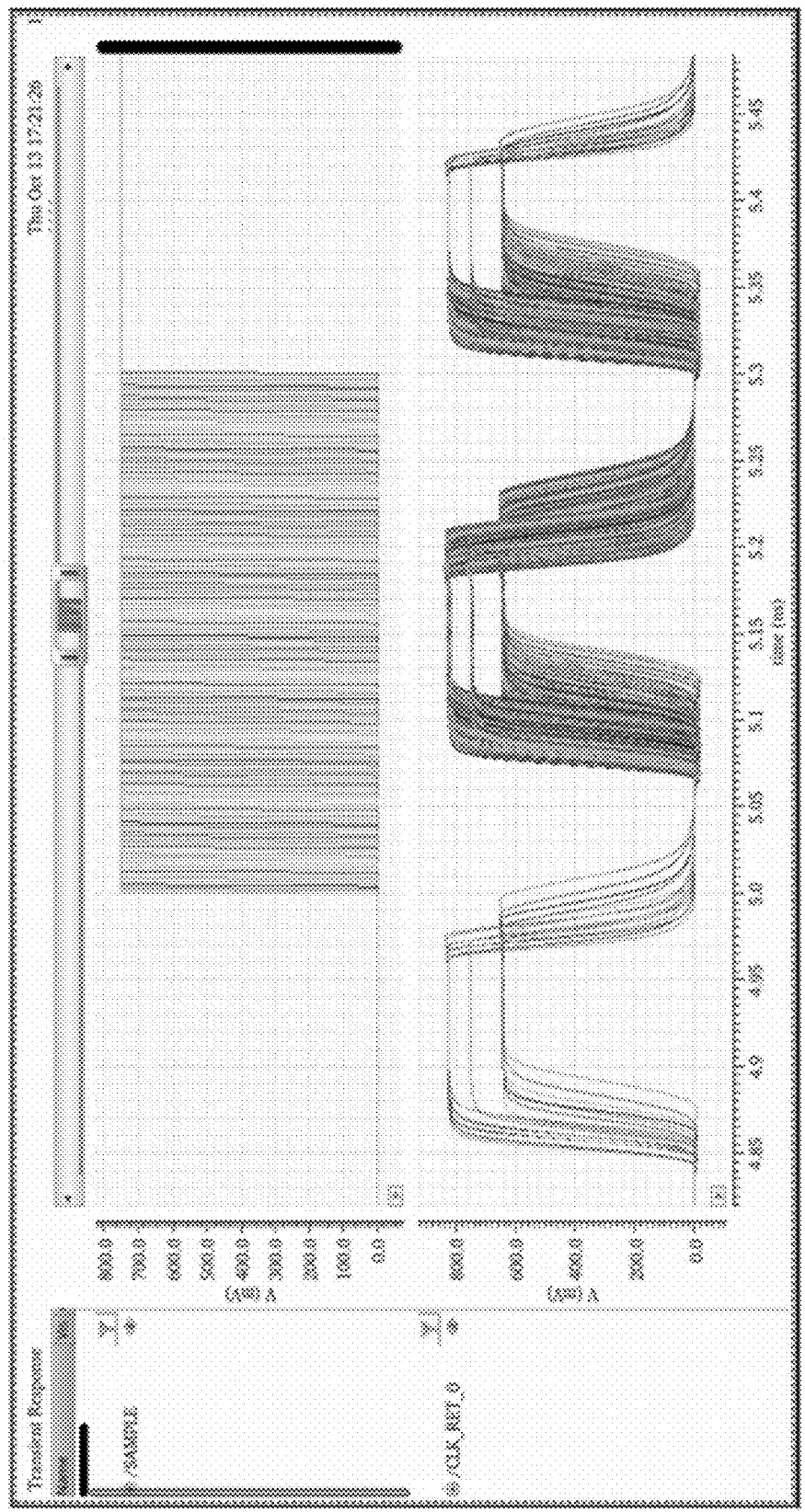

FIGS. 32-35 show graphs of simulation waveforms 3200, 3300, 3400, and 3500 according to embodiments of the present disclosure. FIG. 32 shows an SP-DCDL simulation waveform with increased rise slew. The glitch is avoided by having fast rise slew on EN_RET_1. FIG. 33 shows a simulation waveform having multiple samples with fast rise slew. FIG. 34 shows an across corner code decrement simulation waveform. Here, no glitch was observed during code decrement for SP-DCDL. FIG. 35 shows an enlarged version around the code change.

Figure 36:
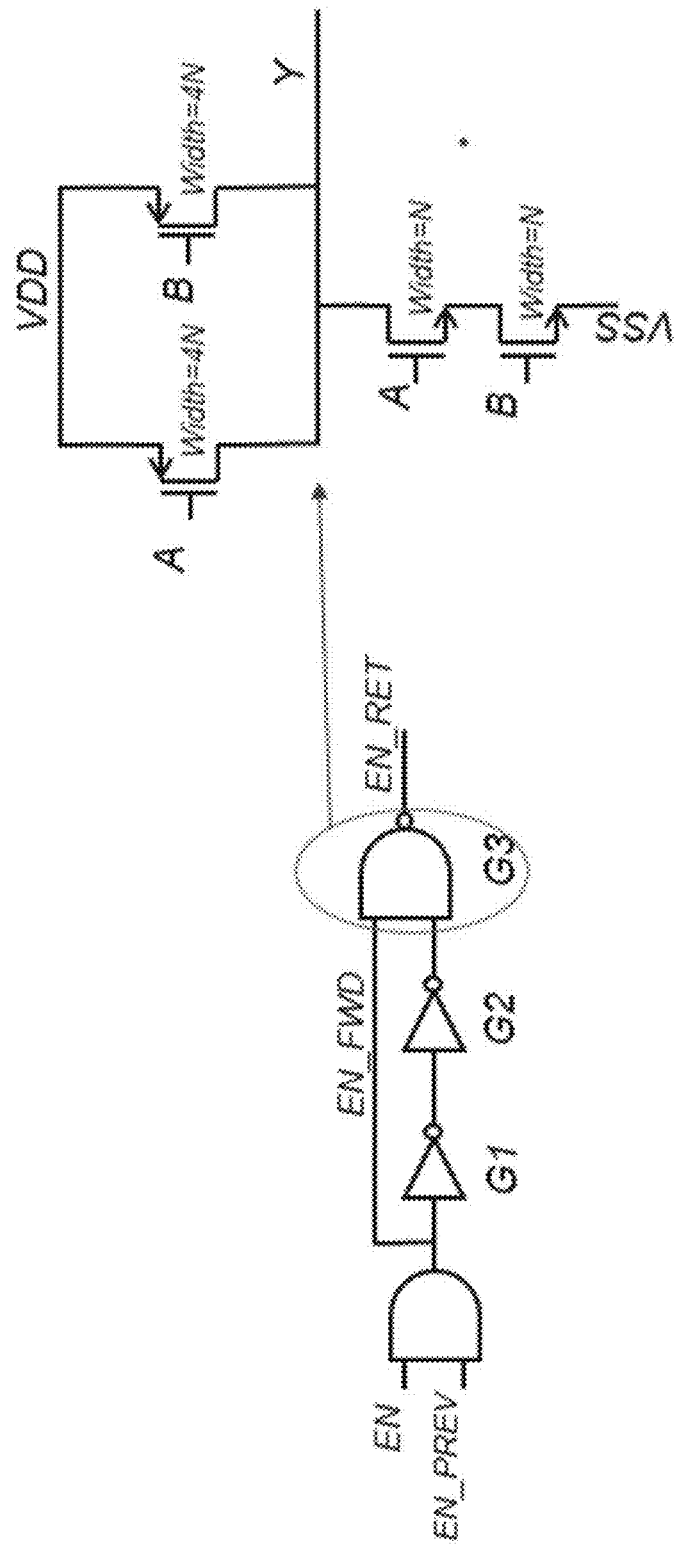
FIG. 36 is a diagram showing updated delay line code logic according to an embodiment of the present disclosure.
Figure 37:
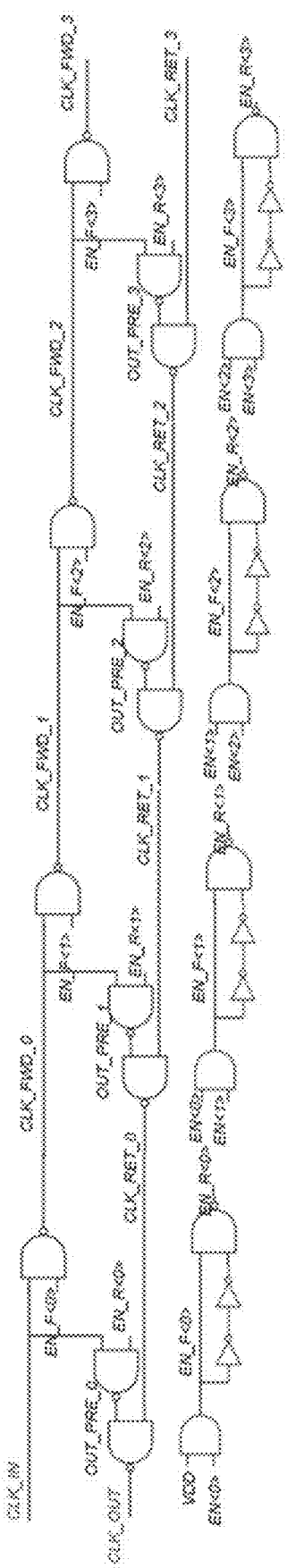
FIG. 37 is a diagram showing a delay line implementation according to an embodiment of the present disclosure.

Referring now to FIG. 36, a diagram showing updated delay line code logic 3600 according to an embodiment of the present disclosure is shown. Here, the make before break approach is ensured by G1 and G2. Slow fall time and fast rise time for EN_RET is ensured by G3. In some embodiments, the PMOS gate width may be approximately 4N and the NMOS gate width may be approximately N. FIG. 36 shows example code update logic and G3 implementation and FIG. 37 shows an example final delay line implementation 3700.

Figure 38:
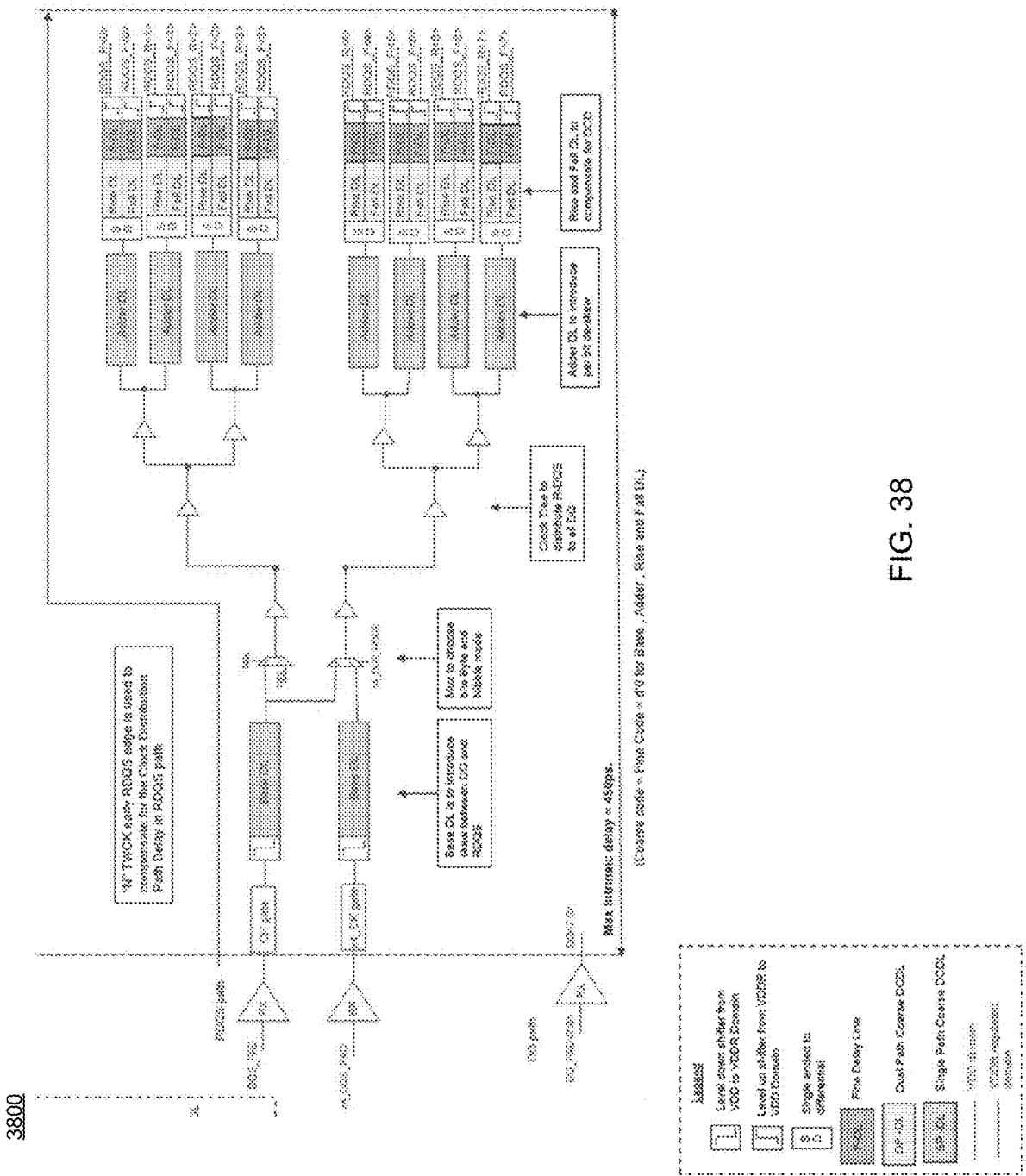
FIG. 38 is a diagram showing an clocking architecture according to an embodiment of the present disclosure.

Referring now to FIG. 38, a diagram showing a clocking architecture 3800 according to an embodiment of the present disclosure is provided. With the use of the SP-DCDL along with the DP-DCDL, the intrinsic delay of clock path is reduced. Since the SP-DCDL allows for an on-the-fly coarse code update, we no longer need a fine delay element with each delay line. The reduced intrinsic delay results in jitter improvement. However, one fine delay element may be needed in the total clock path to obtain smaller delay resolution. Although the fine delay could have been used with either of base, adder, rise/fall delay line, it is possible to use a fine delay element with the rise/fall delay line. DP-DCDL should be used along with fine delay element. Base delay line can have maximum code corresponding to 1UI, adder delay line has a maximum code for 150 ps while rise/fall delay line can have a maximum code for 30 ps. Rise/fall delay line is smallest length delay line present in the clock path. Hence, any performance penalty of power, area and mismatch coming from DP-DCDL will be the lowest. Mismatch performance should be better since non-common elements are not present in base and adder delay line and are only present in rise/fall delay lines. Power and area savings are maximized. Maximum code delay lines (base and adder delay line) are realized using proposed SP-DCDL which is power and area efficient.

Figure 39:
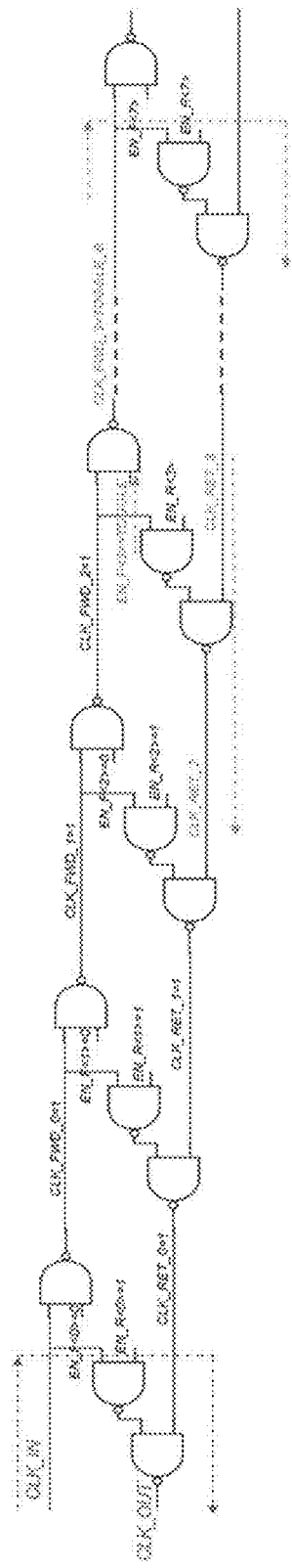
FIG. 39 is a diagram showing anti-aging circuitry according to an embodiment of the present disclosure.
Figure 40:
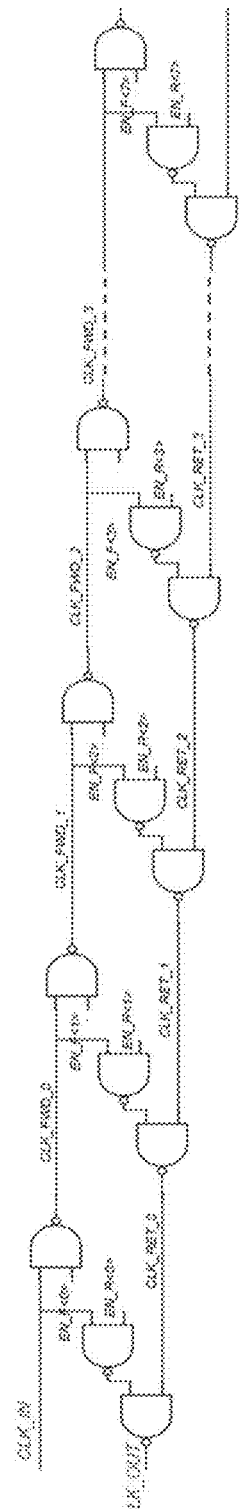
FIG. 40 is a diagram showing anti-aging circuitry according to an embodiment of the present disclosure.

Referring now to FIG. 39, a diagram showing anti-aging circuitry 3900 according to an embodiment of the present disclosure is shown. When devices age, its characteristics may change based on whether it toggles or not. If the device consistently changes state while aging, the delta in rise/fall propagation is negligible. If the device is in a static state while aging, the delta in rise/fall propagation can be significant. This leads to duty cycle impacts on clocking within the PHY. Since the PHY uses both edges of the clock for the memory clock/DQS/DQ, the duty cycle impact affects the timing characteristics. Even when a delay line is always active, the part of the delay line not being used is in a static state. PVT changes or a frequency change can cause more delay elements to be used after a period of aging, affecting the duty cycle of the output. When delay lines are inactive (during normal operation or low power scenarios), the entire delay line is in a static state and will age asymmetrically. To avoid asymmetric aging of DCDLs, the inactive part of the delay line is made to toggle with a slow clock. The proposed SP-DCDL included herein has a unique anti-aging implementation to compensate for duty cycle distortion (DCD). FIG. 40 shows a diagram showing anti-aging circuitry 4000 according to an embodiment of the present disclosure.

Figure 41:
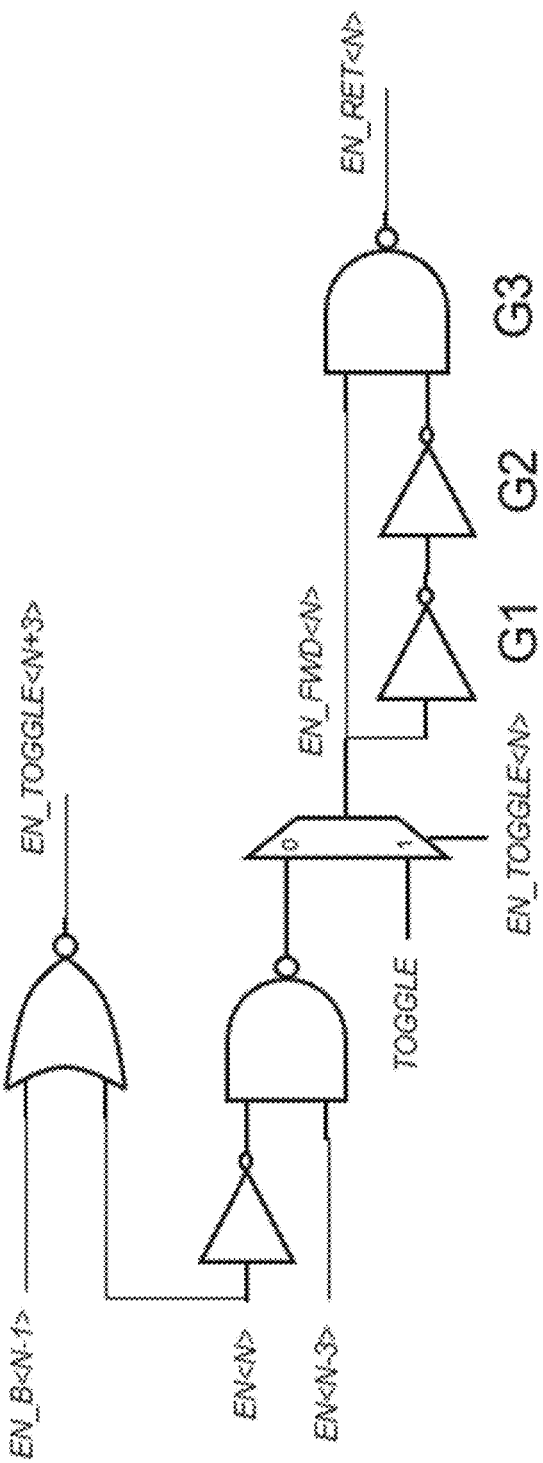
FIG. 41 is a diagram showing an example of toggle logic circuitry according to an embodiment of the present disclosure.

Referring now to FIG. 41, a diagram showing an example of toggle logic circuitry 4100 according to an embodiment of the present disclosure is shown. Based on the requirements shown above for different delay codes, FIG. 41 shows an example of toggle mode logic implementation. This logic still incorporates the requirements from SP-DCDL shown in FIGS. 36-37.

Figure 42:
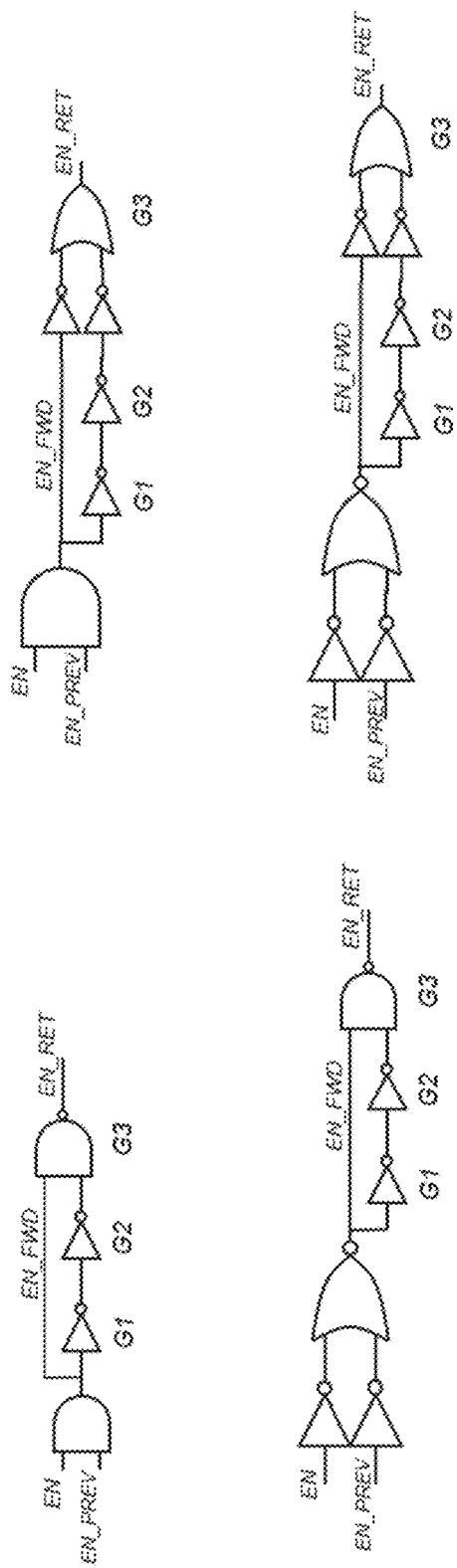
FIG. 42 is a diagram showing alternative circuit implementations according to an embodiment of the present disclosure.

Referring now to FIG. 42, a diagram showing alternative circuit implementations 4200 according to an embodiment of the present disclosure is shown. The logic being implemented in the upper left circuit is EN_FWD=EN AND EN_PREV and EN_RET=EN NAND EN_PREV.

Referring again to FIG. 38, numerous alternative training methods may be used without departing from the scope of the present disclosure. For the purpose of aligning the RDQS position with respect to data, initial training is performed. During initial training, respective codes of base delay line, adder delay line, rise delay line and fall delay line is found which ensures that for each Data (DQ) bit, Clock/Strobe (RDQS) is aligned at the center. This will ensure Data DQ is sampled correctly. After the system starts to run, Voltage and Temperature (VT) drifts, causing the RDQS position with respect to DQ to change. The delay line codes need to be updated in order to compensate for the VT drift. While the delay line codes are updated, the data traffic and clock are running. Hence, the delay code update has to be on-the-fly, glitch-less and with minimum step size. The proposed clocking architecture shown in FIG. 38 uses proposed SP-DCDL shown in FIG. 23 as the base and adder delay line. This proposed SP-DCDL ensures on-the-fly and glitch-less operation. However, the minimum granularity of code change for proposed SP-DCDL of FIG. 23 is 1 coarse delay element. Some of the applications might find the 1 coarse delay element granularity of proposed SP-DCDL to be higher. In all such applications, the proposed clocking architecture of FIG. 38 may still be used with delay codes updated due to VT drift being absorbed in rise/fall delay lines. Rise/fall delay lines have fine delay element as shown in FIG. 38. The minimum granularity of code changes for rise/fall delay line is 1 fine delay step. A fine delay step=coarse delay step/8. Whenever the system finds idle time, i.e., when the clock/data is not running, the common delay of rise/fall delay lines can be moved to respective adder delay line and/or the common delay of all the adder delay lines can be moved to base delay line.

The techniques and features described by the present disclosure (e.g., the structures, architectures and schemes provided herein) may eliminate the need for the clock gating and sequencing schemes discussed above, which may save area and power characteristics of the system, and reduce complexity, thus saving man hours spent on execution and verification of the system. The structures, architectures and schemes described herein may be compact, area efficient, modular, and extendable to create more delay in the delay line easily. The modular delay line structures, architectures and schemes provided herein may enable a regular layout of a delay line, which may ensure linearity of delay line code and ease of layout.

It will be apparent to those skilled in the art that various modifications and variations can be made to the embodiments of the present disclosure as described without departing from the spirit or scope of the invention. Thus, it is intended that embodiments of the present disclosure cover the modifications and variations of this invention provided they come within the scope of the appended claims and their equivalents.

What is claimed is:

1. A high-speed clocking circuit, comprising:
a single path digitally controlled coarse delay line including multiple stages, wherein each of the multiple stages includes a plurality of inverters and a logic gate electrically connected in series that are configured to enable a forward path of the single path digitally controlled coarse delay line prior to disabling a return path of the single path digitally controlled coarse delay line to minimize glitching.

2. The circuit of claim 1, wherein the logic gate is a NAND gate including a plurality of PMOS having a gate width of approximately 4N and a plurality of NMOS having a gate width of approximately N.

3. The circuit of claim 1, further comprising:
a dual path coarse delay line electrically connected with the single path digitally controlled coarse delay line to generate a hybrid dual path coarse delay line.

4. The circuit of claim 2, wherein the single path digitally controlled coarse delay line includes anti-aging circuitry configured to compensate for duty cycle distortion.

5. The circuit of claim 4, wherein the anti-aging circuitry operates based upon, at least in part, an encoding scheme configured to toggle at least a portion of the single path digitally controlled coarse delay line.

6. The circuit of claim 5, wherein the anti-aging circuitry includes a multiplexer configured to receive a toggle signal and to generate an output to a NAND gate and a plurality of inverters.

7. The circuit of claim 1, wherein the logic gate is a NAND gate.

8. The circuit of claim 1, wherein the logic gate is an XOR gate that is fed by at least one additional inverter.

9. The circuit of claim 3, wherein the hybrid dual path coarse delay line further includes a fine delay line.

10. The circuit of claim 3, wherein the hybrid dual path coarse delay line further includes a base delay line and an adder delay line.

11. A high-speed clocking method, comprising:
providing a single path digitally controlled coarse delay line including multiple stages, wherein each of the multiple stages includes a plurality of inverters and a logic gate electrically connected in series; and
enabling a forward path of the single path digitally controlled coarse delay line prior to disabling a return path of the single path digitally controlled coarse delay line to minimize glitching.

12. The method of claim 11, wherein the logic gate is a NAND gate including a plurality of PMOS having a gate width of approximately 4N and a plurality of NMOS having a gate width of approximately N.

13. The method of claim 11, further comprising:
electrically connecting a dual path coarse delay line with the single path digitally controlled coarse delay line to generate a hybrid dual path coarse delay line.

14. The method of claim 12, further comprising:
compensating for duty cycle distortion using anti-aging circuitry associated with the single path digitally controlled coarse delay line.

15. The method of claim 14, further comprising:
toggling at least a portion of the single path digitally controlled coarse delay line based upon, at least in part, an encoding scheme associated with the anti-aging circuitry.

16. The method of claim 15, further comprising:
receiving a toggle signal at a multiplexer associated with the anti-aging circuitry; and
generating an output at the multiplexer; and
providing the output to a NAND gate and a plurality of inverters.

17. The method of claim 11, wherein the logic gate is a NAND gate.

18. The method of claim 11, wherein the logic gate is an XOR gate that is fed by at least one additional inverter.

19. The method of claim 13, wherein the hybrid dual path coarse delay line further includes a fine delay line.

20. The method of claim 13, wherein the hybrid dual path coarse delay line further includes a base delay line and an adder delay line.

* * * * *